United States Patent
Chen et al.

(10) Patent No.: US 11,522,357 B2
(45) Date of Patent: Dec. 6, 2022

(54) TERMINAL DEVICE, METHOD FOR MONITORING BATTERY SAFETY OF TERMINAL DEVICE

(71) Applicant: GUANGDONG OPPO MOBILE TELECOMMUNICATIONS CORP., LTD., Guangdong (CN)

(72) Inventors: Wei Chen, Guangdong (CN); Zhihua Hu, Guangdong (CN); Hui Zhang, Guangdong (CN); Jialiang Zhang, Guangdong (CN); Shebiao Chen, Guangdong (CN)

(73) Assignee: GUANGDONG OPPO MOBILE TELECOMMUNICATIONS CORP., LTD., Dongguan (CN)

( * ) Notice: Subject to any disclaimer, the term of this patent is extended or adjusted under 35 U.S.C. 154(b) by 503 days.

(21) Appl. No.: 16/372,795

(22) Filed: Apr. 2, 2019

(65) Prior Publication Data
US 2020/0099216 A1 Mar. 26, 2020

Related U.S. Application Data

(63) Continuation of application No. PCT/CN2017/099131, filed on Aug. 25, 2017.

(51) Int. Cl.
*H02J 7/00* (2006.01)
*H02H 7/18* (2006.01)
(Continued)

(52) U.S. Cl.
CPC .............. *H02H 7/18* (2013.01); *G01R 31/388* (2019.01); *H01M 10/486* (2013.01);
(Continued)

(58) Field of Classification Search
CPC ............ H02M 1/32; H02M 2001/322; H02M 2001/327; H02M 1/34; H02M 2001/342;
(Continued)

(56) References Cited

U.S. PATENT DOCUMENTS 3,895,283 A * 7/1975 Peterson ........... H02J 7/007194
322/33
5,017,856 A * 5/1991 Johnson, Jr. .......... H01M 10/44
320/106

(Continued)

FOREIGN PATENT DOCUMENTS

CN 101425678 A 5/2009
CN 102403551 A 4/2012
(Continued)

OTHER PUBLICATIONS

European Search Report issued in corresponding European Application No. 17922507.3 dated May 8, 2020.
(Continued)

*Primary Examiner* — Thienvu V Tran
*Assistant Examiner* — Nusrat Quddus
(74) *Attorney, Agent, or Firm* — Young Basile Hanlon & MacFarlane, P.C.

(57) ABSTRACT

A terminal device, a method for monitoring battery safety of a terminal device, and a system for monitoring battery safety of a terminal device are provided. The method for monitoring battery safety includes the following. Acquire status information of a battery of the terminal device. Determine whether the terminal device meets a preset safety hazard condition according to the status information. Upon determining that the terminal device meets the preset safety hazard condition, control the terminal device to be in a power-off state or disconnect a power supply circuit.

12 Claims, 7 Drawing Sheets

(51) Int. Cl.
  *G01R 31/388* (2019.01)
  *H01M 10/48* (2006.01)
  *H02H 1/00* (2006.01)
(52) U.S. Cl.
  CPC ........ *H01M 10/488* (2013.01); *H02H 1/0007* (2013.01); *H02J 7/0031* (2013.01); *H02J 7/00309* (2020.01)
(58) Field of Classification Search
  CPC ..... H02M 2001/344; H02M 2001/346; H02M 2001/348; H02M 1/36; H02M 1/38; H02M 1/42; H02M 1/4208; H02M 1/4216; H02M 1/4225; H02M 1/4233; H02M 1/4241; H02M 1/425; H02M 1/4258; H02M 1/4266; H02M 2001/4275; H02M 2001/4283; H02M 2001/4291; H02J 7/00; H02J 7/0016; H02J 7/0021; H02J 7/0026; H02J 7/0029–0036; H02J 7/0047–005; H02J 7/06–087; G01R 31/50; G01R 31/52; G01R 31/327
  See application file for complete search history.

(56) References Cited

U.S. PATENT DOCUMENTS

| | | | | |
|---|---|---|---|---|
| 5,391,974 | A * | 2/1995 | Shiojima | H02J 7/0091 320/150 |
| 5,874,823 | A * | 2/1999 | Suzuki | H02J 7/0014 320/125 |
| 6,100,672 | A * | 8/2000 | Siponen | H02J 7/00712 320/150 |
| 6,255,803 | B1 * | 7/2001 | Ishihara | G01R 31/3648 320/136 |
| 8,274,261 | B2 * | 9/2012 | Seman, Jr | H02J 7/0019 320/134 |
| 8,299,759 | B2 * | 10/2012 | Okamura | H02J 7/005 320/135 |
| 8,305,041 | B2 * | 11/2012 | Takeda | H01M 10/425 320/134 |
| 8,524,385 | B2 * | 9/2013 | Takeda | H02J 7/0031 429/90 |
| 8,655,535 | B2 * | 2/2014 | Oh | B60L 3/04 701/22 |
| 8,797,171 | B2 * | 8/2014 | Yasuda | H02J 7/007182 340/636.1 |
| 9,099,871 | B2 * | 8/2015 | White | H02J 7/0014 |
| 2002/0001745 | A1 | 1/2002 | Gartstein et al. | |
| 2002/0041174 | A1 * | 4/2002 | Purkey | H02J 7/345 320/103 |
| 2004/0189245 | A1 * | 9/2004 | Teraoka | H02J 7/0031 320/107 |
| 2004/0189257 | A1 * | 9/2004 | Dougherty | B60L 58/16 320/132 |
| 2006/0186859 | A1 * | 8/2006 | Fujikawa | H02J 7/0031 320/134 |
| 2007/0145949 | A1 * | 6/2007 | Matsushima | H02J 7/00 320/132 |
| 2007/0188141 | A1 * | 8/2007 | Hamaguchi | H02J 7/0047 320/128 |
| 2008/0048621 | A1 * | 2/2008 | Yun | H02J 7/0063 320/136 |
| 2008/0150369 | A1 * | 6/2008 | Suzuki | H02M 1/36 307/99 |
| 2009/0128157 | A1 * | 5/2009 | Moriya | G01R 31/3842 324/426 |
| 2009/0153103 | A1 * | 6/2009 | Ikeuchi | H02J 7/00036 320/152 |
| 2009/0155674 | A1 * | 6/2009 | Ikeuchi | H01M 10/443 429/91 |
| 2009/0189257 | A1 * | 7/2009 | Seki | H01L 29/861 257/626 |
| 2009/0189570 | A1 * | 7/2009 | Abe | H02J 7/007194 320/162 |
| 2009/0202890 | A1 * | 8/2009 | Takeda | H01M 2/348 429/62 |
| 2009/0309547 | A1 * | 12/2009 | Nakatsuji | H02J 7/0086 320/134 |
| 2010/0092844 | A1 | 4/2010 | Takeda | |
| 2010/0123434 | A1 * | 5/2010 | Iwata | H02J 7/0026 320/118 |
| 2010/0194398 | A1 * | 8/2010 | Kawasumi | H01M 50/572 324/430 |
| 2011/0241693 | A1 * | 10/2011 | Kurata | G01R 31/3842 324/427 |
| 2011/0282604 | A1 * | 11/2011 | Nagai | G06F 1/263 702/63 |
| 2012/0081076 | A1 | 4/2012 | Fujimura et al. | |
| 2014/0184235 | A1 * | 7/2014 | Ikeuchi | H01M 10/486 324/427 |
| 2014/0300366 | A1 * | 10/2014 | Kobayakawa | H02J 7/0047 324/433 |
| 2015/0153416 | A1 * | 6/2015 | Umemura | H01M 10/443 320/107 |
| 2015/0184913 | A1 * | 7/2015 | Hashimoto | F25B 49/025 62/228.1 |
| 2015/0200553 | A1 * | 7/2015 | Endo | H02J 7/0031 320/134 |
| 2015/0333381 | A1 * | 11/2015 | Lux | H01M 10/625 429/50 |
| 2017/0082693 | A1 * | 3/2017 | Leidich | H01M 10/48 |
| 2017/0113680 | A1 * | 4/2017 | Shimizu | B60L 3/0092 |
| 2017/0123008 | A1 * | 5/2017 | Frias | G01R 31/52 |
| 2017/0126123 | A1 * | 5/2017 | Hsiung | H02J 7/00 |
| 2017/0163068 | A1 * | 6/2017 | Li | H01M 10/4257 |
| 2017/0184658 | A1 * | 6/2017 | Uemura | H01L 27/0617 |
| 2019/0031126 | A1 * | 1/2019 | Kawauchi | H02H 7/18 |
| 2019/0212394 | A1 * | 7/2019 | Chen | H01M 10/486 |
| 2019/0212395 | A1 * | 7/2019 | Chen | H02J 7/0029 |
| 2019/0317154 | A1 * | 10/2019 | Chen | G01R 31/3842 |
| 2020/0075926 | A1 * | 3/2020 | Torok | H01M 10/4257 |

FOREIGN PATENT DOCUMENTS

| | | |
|---|---|---|
| CN | 203014355 U | 6/2013 |
| CN | 203572592 U | 4/2014 |
| CN | 103809066 A | 5/2014 |
| CN | 106353684 A | 1/2017 |
| GB | 2539187 A | 12/2016 |
| JP | 2009049005 A | 3/2009 |
| JP | 2010200574 A | 9/2010 |
| JP | 2012052857 A | 3/2012 |
| JP | 2012060281 A | 3/2012 |
| JP | 2014022282 A | 2/2014 |
| JP | 2015115232 A | 6/2015 |
| KR | 10-2004-0042302 * | 5/2004 |
| KR | 20040042302 A | 5/2004 |
| KR | 20060036584 A | 5/2006 |
| KR | 20070101496 A | 10/2007 |
| KR | 20090066202 A | 6/2009 |
| KR | 101725500 B1 | 4/2017 |
| WO | WO-2010082549 A1 * | 7/2010 ........ G01R 31/3624 |
| WO | 2017006319 A1 | 1/2017 |

OTHER PUBLICATIONS

Office Action 1 issued in corresponding IN application No. 201917020151 dated Jun. 24, 2020 with english translation.

Notice of Reasons for Refusal with English Translation issued in corresponding JP application No. 2019-568182 dated Nov. 13, 2020.

Notification of Reason for Refusal with English Translation issued in corresponding KR application No. 10-2019-7035302 dated Dec. 16, 2020.

China First Office Action with English Translation for CN Application No. 201780051136.7 dated Jun. 28, 2021.

* cited by examiner

TERMINAL DEVICE, METHOD FOR MONITORING BATTERY SAFETY OF TERMINAL DEVICE

CROSS-REFERENCE TO RELATED APPLICATION(S)

This application is a continuation of International Application No. PCT/CN2017/099131, filed on Aug. 25, 2017, the disclosure of which is hereby incorporated by reference in its entirety.

TECHNICAL FIELD

This disclosure relates to the technical field of terminal devices, and more particularly to a method for monitoring battery safety of a terminal device, a system for monitoring battery safety of a terminal device, and a terminal device with the system for monitoring battery safety.

BACKGROUND

A battery is a source of power for a terminal device such as a mobile phone and provides long-term steady power supply for the terminal device. The battery that was first used for the terminal device is a Nickel chromium battery or a Nickel-metal hydride (Ni-MH) battery. However, as a screen of the terminal device is getting larger, the terminal device is getting more powerful, etc., capacities of the Nickel chromium battery and the Ni-MH battery are already unable to satisfy requirements on power. Instead, a Lithium-ion battery has a great number of advantages. For example, due to its high energy density, the Lithium-ion battery can be made lighter and of higher capacity, charges and discharges faster, and has no memory effect compared with the Nickel chromium battery and the Ni-MH battery. In addition, the Lithium-ion battery causes the least harm to elements in the environment. Therefore, the Lithium-ion battery has gradually replaced the conventional Nickel chromium battery and the conventional Ni-MH battery.

Although the Lithium-ion battery has effectively solved the problem of battery capacity, a problem of safety still exists. For example, when the Lithium-ion battery is damaged and thus leads to a short circuit, heat is produced inside a cell. When the heat is produced too fast, the battery will probably burst into fire and explosion. Therefore, safety monitor needs to be conducted on the battery to avoid accidents.

SUMMARY

A first aspect of the present disclosure provides a method for monitoring battery safety of a terminal device. The method includes the following. Acquire status information of a battery of the terminal device. The status information includes at least two of: power-failure information generated upon disconnection between a battery connector of the terminal device and a main board of the terminal device, whether a sudden change in voltage occurs to the battery and whether a battery surface has an abnormal temperature area, a duration of a constant-voltage charging stage during charging of the battery, charging capacity and discharging capacity of the battery, and a voltage decrease rate after the battery is fully charged. Determine whether the terminal device meets a preset safety hazard condition according to the status information. Upon determining that the terminal device meets the preset safety hazard condition, control the terminal device to be in a power-off state or disconnect a power supply circuit.

A second aspect of the present disclosure provides a terminal device. The terminal device includes a battery, a controller configured to carry out the method for monitoring battery safety.

A third aspect of the present disclosure provides non-transitory computer readable storage medium, which is configured to store computer programs which, when executed by a processor, are operable with the processor to carry out the method for monitoring battery safety.

DETAILED DESCRIPTION

Figure 1:
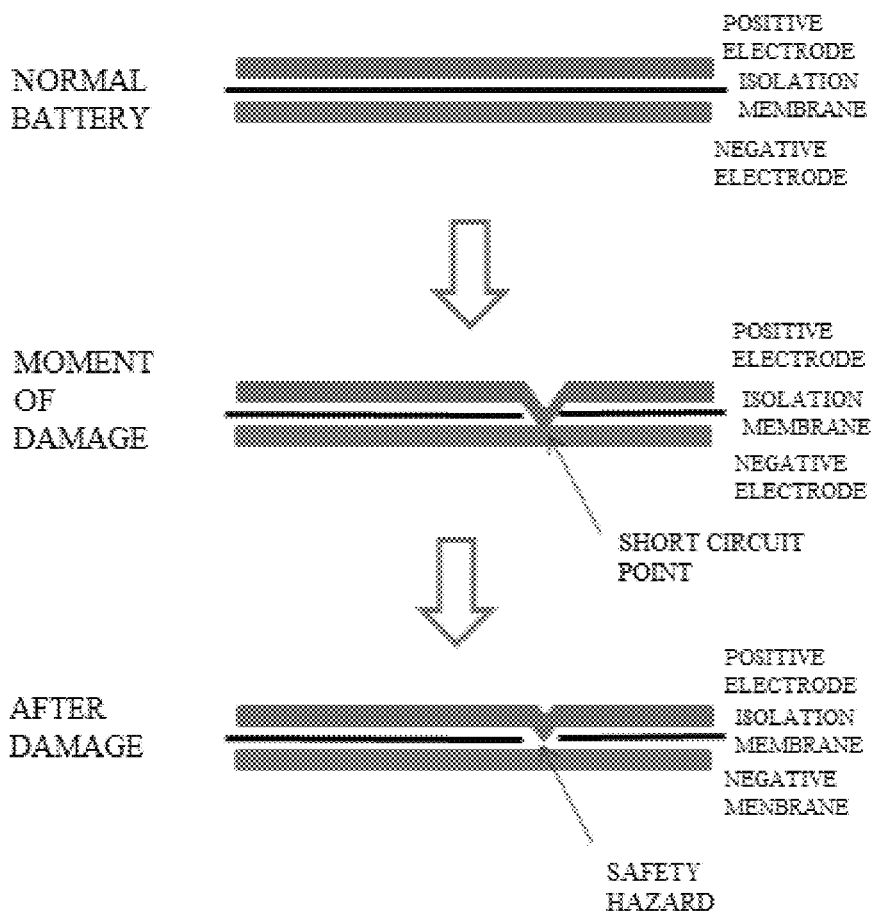
FIG. 1 is a schematic diagram illustrating a battery damage process according to an implementation of the present disclosure.

Implementations of the present disclosure will be further described below with reference to the accompanying drawings, where the same or similar reference numerals denote the same or similar elements or elements with the same or similar functions. It will be appreciated that the implementations described hereinafter with reference to the accompanying drawings are illustrative and for the purpose of explanation rather than restriction of the disclosure.

Before the method for monitoring battery safety of a terminal device, the system for monitoring battery safety of a terminal device, and the terminal device with the system for monitoring battery safety of implementations of the present disclosure are described, a structure of a battery used for terminal devices and battery safety hazard will be first described below.

For instance, a Lithium-ion battery mainly includes a cell and a battery protection system. The cell is known as the "heart" of the Lithium-ion battery and includes anode materials and cathode materials, electrolyte, an isolation membrane, and a housing, and outside the cell is the battery protection system. The anode materials of the cell are Lithium molecular materials such as Lithium Manganate, Lithium Cobaltate, and the like. The anode materials determine energy of the battery. The cathode material is graphite. The isolation membrane is disposed between the anode and the cathode of the battery. To make it easier to understand, the isolation membrane is like a piece of paper which is continuously folded within a small battery case and filled with the anode and cathode materials and the electrolyte. In a charging process, Lithium molecules in the anode material are activated and driven, under the action of an external electric field, to the cathode to be stored in gaps of a graphic electrode structure. Driving more Lithium molecules results in more energy stored. In a discharging process, Lithium ions in the cathode are driven to the anode and become initial Lithium molecules in the anode. The above steps are repeated to achieve charging and discharging of the battery.

The isolation membrane is mainly configured to isolate completely the anode materials from the cathode materials of the cell. Once the anode materials and the cathode materials are in direct contact, a short circuit will occur inside the battery, thereby leading to some potential safety hazard. Therefore, the isolation membrane cannot be too thin since a thin isolation membrane tends to be damaged. However, with more requirements on the terminal device of users, such as a lighter and thinner terminal device, a larger screen, and longer battery life, manufacturers start to look for a battery with higher energy density. For example, increase energy density of the battery by filling in more anode materials and more cathode materials. Nevertheless, for the same volume, more anode materials and cathode materials filled in result in thinner isolation membrane. Since the isolation membrane tends to be damaged when the battery has been subject to damage such as an external impact, the short circuit will probably occur.

As an implementation, when the battery is subject to an external mechanical damage such as squeezing, dropping, and piercing, due to thin isolation membrane, a short circuit between the anode and the cathode (that is, an internal short-circuit within the battery) tends to occur due to damage of isolation membrane. At the moment of the short circuit, a voltage of the battery will be instantly decreased mainly because of a local internal short-circuit point formed inside the battery. A higher degree to which the battery is damaged leads to more serious voltage decrease. At the same time, heating at a short-circuit point is serious, which results in substantially higher temperature at the short-circuit point than at other areas of the battery.

As another implementation, when the terminal device, such as a mobile phone, is in use, it is common for a user of the terminal device or an unauthorized entity to disassemble the mobile phone privately. However, when the mobile phone is privately disassembled, since the manner in which the mobile phone is disassembled and assembled is not standard, it is possible to lead to battery damage to some extent, which will also cause damage of the isolation membrane and further cause a short circuit between the anode and cathode.

In general, as to a particularly serious damage, an area of the internal short-circuit of the battery is large, and heating will continuously occur at a point of damage until the voltage of the battery decreases to 0V (volt). If the voltage of the battery is high, the battery will even burst into fire and burn. As to a minor damage, the area of the internal short-circuit of the battery is small, and a short-circuit current is formed at the short-circuit point. Since the short-circuit current is large, a large quantity of heat is produced at the short-circuit point and temperature thereat gets higher, which will in turn fuse the short-circuit point. Therefore, the voltage of the battery will return to an initial state. In this case, the battery may still be used as usual like a normal battery. However, potential safety hazard already exists in the battery, and the internal short-circuit may be triggered at any time when the battery is in use subsequently. As illustrated in FIG. 1, when the battery is subject to an external mechanical damage, only a minor damage will occur mostly. The internal short-circuit caused as such lasts only a short time, and the battery will soon return to the initial state. However, the isolation membrane is partially damaged at this time. Therefore, such battery abnormality is generally difficult to monitor, while the battery abnormality as such will bring about some potential safety hazard to the terminal device.

As another implementation, in a charging and discharging process of the battery, Lithium ion may accumulate in the anode and the cathode. When accumulation occurs, a type of dendrite, like crystal formed by many substances, is formed and can gradually become longer. In this process, the dendrite may also pierce the isolation membrane, thereby resulting in the internal short-circuit. The situation described in the above implementation, where the battery is restored to the initial state after a short-term internal short-circuit caused by the external mechanical damage, is even more serious in this implementation, that is, the internal short-circuit of the battery is easier to happen again.

Once there is short circuit, when the battery is in use, large quantities of heat will be produced inside the cell. The heat can result in vaporization of the electrolyte inside the cell. When the heat is produced too fast, the vaporization process will be very fast accordingly, which will cause increase in internal pressure of the cell. When the internal pressure reaches up to a certain extent to which the housing is unable to bear, the housing can crack, thereby resulting in explosion. When exposed to open fire, the battery can burst into fire.

In addition, besides increasingly thinner isolation membrane caused by increasing energy density, which results in damage of isolation membrane, thereby causing accidents, quick charging is also one of major factors of battery safety hazard.

Quick charging, as the name suggests, is a process of charging fast a rechargeable battery. For example, a charging process of the battery can include at least one of a trickle charging stage, a constant-current charging stage, and a constant-voltage charging stage. In the trickle charging stage, a current feedback loop can be utilized to make current flowing into the battery in the trickle charging stage satisfy expected charging current of the battery (such as a first charging current). Exemplarily, when voltage is lower than 3.0V, a 100 mA (milliampere) charging current is adopted to pre-charge the battery. In the constant-current charging stage, the current feedback loop can be utilized to make current flowing into the battery in the constant-current charging stage satisfy expected charging current of the battery (such as a second charging current, which may be larger than the first charging current). Exemplarily, the charging current can range from 0.1 C (Coulomb) to several Coulombs for different batteries, where C represents battery capacity. Generally, in the constant-current charging stage, a 0.1 C charging current is adopted for charging in a normal charging mode. However, in a quick charging mode, a charging current larger than 0.1 C is adopted for charging in the constant-current charging stage to complete charging within a short time period. In the constant-voltage charging stage, a voltage feedback loop can be utilized to make voltage applied to the battery in the constant-voltage charging stage satisfy expected charging voltage of the battery. Exemplarily, when the voltage of the battery is equal to 4.2V, proceed to the constant-voltage charging stage, in which charging voltage is constantly 4.2V. When the battery is gradually fully charged, the charging current can be decreased. When the charging current is smaller than 100 mA, it can be determined that the battery is fully charged.

In the constant-current charging stage, since the charging current is large (such as 0.2 C~0.8 C, or even up to 1 C) and the charging process of the battery is an electrochemical reaction process, heat is certainly produced in this process. In addition, larger charging current leads to larger quantities of heat produced within a short time period. When the isolation membrane has been damaged, the short circuit between the anode and cathode will be easily triggered. Once short circuit occurs, more heat tends to be produced, and vaporization of the electrolyte occurs, which can cause increase in internal pressure of the cell. When the internal pressure reaches up to a certain extent to which the housing is unable to bear, the housing can crack, thereby resulting in explosion. When in contact with open fire, the battery can burst into fire.

In other words, once there is internal short-circuit in the battery, the battery is abnormal and thus some potential safety hazard exists, which may result in accidents when the battery is in use.

Therefore, in order to monitor effectively whether the battery has been damaged for fear of battery safety hazard, thereby avoiding accidents, the present disclosure provides a method for effectively monitoring battery safety to monitor whether a safety hazard condition is triggered.

The following will describe the method for monitoring battery safety of a terminal device, the system for monitoring battery safety of a terminal device, and the terminal device according to implementations of the present disclosure with reference to the accompanying drawings.

It should be noted that, in implementations of the present disclosure, the "terminal device" can include but is not limited to a device configured via a wired line and/or a wireless interface to receive/transmit communication signals. Examples of the wired line may include, but are not limited to, at least one of a public switched telephone network (PSTN), a digital subscriber line (DSL), a digital cable, a direct connection cable, and/or another data connection line or network connection line. Examples of the wireless interface may include, but are not limited to, a wireless interface with a cellular network, a wireless local area network (WLAN), a digital television network (such as a digital video broadcasting-handheld (DVB-H) network), a satellite network, an AM-FM broadcast transmitter, and/or with another communication terminal. A communication terminal configured to communicate via a wireless interface may be called a "wireless communication terminal", a "wireless terminal", and/or a "mobile terminal". Examples of a mobile terminal may include, but are not limited to, a satellite or cellular telephone, a personal communication system (PCS) terminal capable of cellular radio telephone, data processing, fax, and/or data communication, a personal digital assistant (PDA) equipped with radio telephone, pager, Internet/Intranet access, web browsing, notebook, calendar, and/or global positioning system (GPS) receiver, and/or other electronic devices equipped with radio telephone capability such as a conventional laptop or a handheld receiver.

Figure 2:
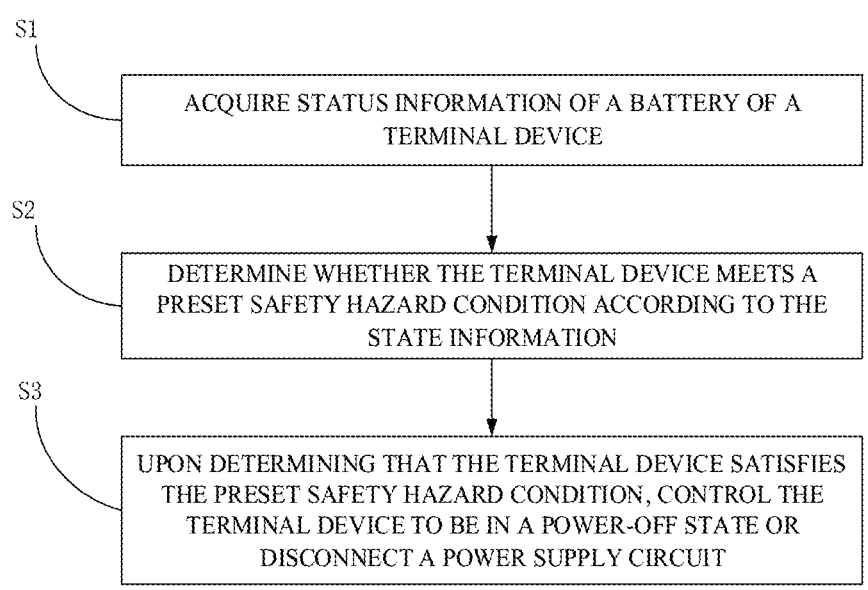
FIG. 2 is a flowchart illustrating a method for monitoring battery safety of a terminal device according to an implementation of the present disclosure.

FIG. 2 is a flowchart illustrating a method for monitoring battery safety of a terminal device according to an implementation of the present disclosure. In the method, battery-abnormality can be comprehensively monitored, whether the safety hazard condition is triggered can be determined according to the monitored status information of the battery, and when the safety hazard condition is triggered, disconnect directly a power supply circuit (such as a power supply circuit for serving the battery) or control the terminal device to be in the power-off state.

As illustrated in FIG. 2, the method for monitoring battery safety of a terminal device begins at S1.

At S1, acquire status information of a battery of the terminal device. The status information of the battery includes at least two of: power-failure information generated upon disconnection between a battery connector of the terminal device and a main board of the terminal device, whether a sudden change in voltage has occurred to the battery and whether a battery surface has an abnormal temperature area, a duration of a constant-voltage charging stage during charging of the battery, charging capacity and discharging capacity of the battery (that is, battery capacity corresponding to a charging process and battery capacity corresponding to a discharging process), and a voltage decrease rate after the battery is fully charged.

Figure 3:
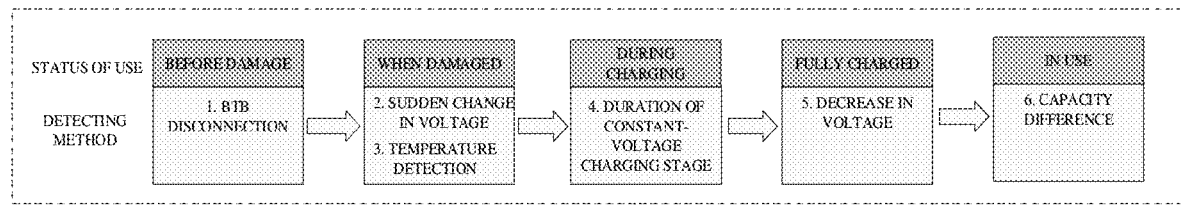
FIG. 3 is a schematic diagram illustrating a full-range abnormality monitoring of a battery according to an implementation of the present disclosure.

In an implementation, as illustrated in FIG. 3, battery-abnormality monitoring can be conducted throughout the battery life of the battery. For example, before the battery is damaged, whether the disconnection between the battery connector and the main board is a private disconnection can be determined by acquiring the power-failure information generated when the battery connector is disconnected from the main board; when the battery is damaged, whether the battery is currently abnormal due to damage can be determined by monitoring whether the sudden change in voltage has occurred to the battery and detecting temperatures of the battery surface; during charging of the battery, whether the battery is abnormal can be determined by monitoring the duration of the constant-voltage charging stage during charging of the battery; after the battery is fully charged, whether the battery is abnormal can be determined by monitoring the voltage decrease rate within a preset time period; when the battery is in use, for example, during charging and discharging, whether the battery is abnormal can be determined by monitoring change in capacity of the battery.

At S2, etermine, according to the status information, whether the terminal device meets a preset safety hazard condition. The safety hazard condition refers to a condition for a battery having a safety risk.

In an implementation, the preset safety hazard condition includes any two of the following: (1) the disconnection between the battery connector and the main board is determined to be the private disconnection according to the power-failure information; (2) the sudden change in voltage has occurred to the battery and the battery surface has the abnormal temperature area; (3) the duration of the constant-voltage charging stage during charging of the battery is longer than or equal to a preset duration; (4) a charging-discharging capacity difference of the battery is determined not to be within a preset capacity range according to the charging capacity and discharging capacity; (5) the voltage decrease rate after the battery is fully charged is greater than or equal to a preset rate.

At S3, upon determining that the terminal device meets the preset safety hazard condition, control the terminal device to be in the power-off state, or disconnect the power supply circuit, to achieve effective safety protection.

In an implementation, when the battery connector is disconnected from the main board, generate power-failure state bit information, and take the power-failure state bit information as the power-failure information. If the power-failure state bit information is not reset or is not marked, determine that the disconnection between the battery connector and the main board is the private disconnection.

Specifically, whether the disconnection between the battery connector and the main board is the private disconnection can be determined by acquiring the power-failure information generated when the battery connector is disconnected from the main board and determining, according to the power-failure information, whether the disconnection between the battery connector and the main board is the private disconnection, which will be detailed below.

First, acquire the power-failure information generated when the battery connector is disconnected from the main board. Such disconnection behavior can be detected through a detecting circuit for detecting whether the battery connector is disconnected from the main board.

In an implementation, the battery connector is a board to board (BTB) connector, and the BTB connector can include a metal pressure plate, through which the above-mentioned detecting circuit can be short-circuited. In this way, when the metal pressure plate is taken out or disconnected, the detecting circuit is changed from a short-circuit state to an open-circuit state. Open-circuit refers to a circuit state where no current passes through between two points in a circuit or a conductor with a very large resistance value (or resistance value) is connected in the circuit. As such, when the detecting circuit is changed to the open-circuit state, determine that the metal pressure plate has been taken out or disconnected, thereby further determining that the battery connector is disconnected from the main board.

The terminal device such as a mobile phone can usually include a metal housing, and the metal housing can be connected and fixed with a body of the terminal device through adhesion, welding, etc. In general, since the battery is a built-in battery of the terminal device, the metal housing will not be removed unless the battery is disassembled. Therefore, the above-mentioned detecting circuit can also be short-circuited through the metal housing, such that the detecting circuit will be changed from the short-circuit state to the open-circuit state when the metal housing is removed. In this way, it is possible to determine that the metal housing is removed when the detecting circuit changes into the open-circuit state, and further determine that the battery connector is disconnected from the main board.

The above-mentioned detecting circuit can also be connected with a central processing unit (CPU) of the main board. When the detecting circuit detects that the connector is disconnected from the main board, the CPU can control a status register thereof to generate the power-failure state bit information and to take the power-failure state bit information as the power-failure information.

Second, determine, according to the power-failure information, whether the disconnection between the battery connector and the main board is the private disconnection.

It should be understood that, the disconnection between the battery connector and the main board may be an after-sale disconnection, for example, an authorized entity disassembles the battery during a professional repair or detection, or may be the private disconnection, for example, a user of the terminal device or an unauthorized entity disassembles the battery privately.

When the authorized entity disassembles the battery, such disassembly behavior can be marked as normal through some operations, such as resetting or marking the power-failure state bit information.

For instance, in an implementation, power-failure state bit will be set to 1 when the battery connector is disconnected from the main board. When the authorized entity disassembles the battery, a resetting instruction can be written into programs run in the CPU to restore the power-failure state bit set from 1 to 0. Alternatively, the power-failure state bit information can be reset through a real-time clock (RTC).

In an implementation, the power-failure state bit information can be marked through a power-on-again identifier of a power management integrated circuit (PMIC).

As such, whether the power-failure state bit information is reset can be determined. If the power-failure state bit information is reset, determine that the disconnection between the battery connector and the main board is the after-sale disconnection; if the power-failure state bit information is not reset, determine that the disconnection between the battery connector and the main board is the private disconnection.

Exemplarily, after the battery connector is reconnected with the main board, if the power-failure state bit remains 1, the disconnection between the battery connector and the main board can be determined to be the private disconnection, whereas the disconnection between the battery connector and the main board can be determined to be the after-sale disconnection if the power-failure state bit is 0.

Alternatively, whether the power-failure state bit information is marked can be determined. If the power-failure state bit information is marked, the disconnection between the battery connector and the main board can be determined to be the after-sale disconnection; if the power-failure state bit information is not marked, the disconnection between the battery connector and the main board can be determined to be the private disconnection.

Exemplarily, after the battery connector is reconnected with the main board, if the PMIC-power-on-again identifier exists in the power-failure state bit information, the disconnection between the battery connector and the main board can be determined to be the after-sale disconnection; if there is no PMIC-power-on-again identifier in the power-failure state bit information, the disconnection between the battery connector and the main board can be determined to be the private disconnection.

It should be understood that, since the authorized entity can disassemble or assemble the mobile phone in a relatively standard manner, the after-sale disconnection will generally not cause battery safety hazard. Therefore, when the disconnection between the battery connector and the main board is the after-sale disconnection, the terminal device can be determined to be in a state where the battery can be safely used ("battery-safety state" for short). When the terminal device is determined to be in the battery-safety state, the terminal device can be controlled to send alert information indicative of battery safety, whereby the user can be reassured to use the terminal device.

However, since the user of the terminal device or the unauthorized entity may disassemble or assemble the terminal device in a non-standard manner, the private disconnection will usually lead to battery damage, such as making the battery subject to an external impact which is beyond an extent to which the battery is able to bear, contact failure when the battery connector and the main board are reconnected, etc., thereby resulting in battery safety hazard. Therefore, when the disconnection between the battery connector and the main board is the private disconnection, information regarding the private disconnection can be recorded to mark such private-disassembly behavior.

In an implementation, the battery surface is divided into multiple areas. When an instant drop in voltage has occurred to the battery and the temperature of any one of areas of the battery is higher than that of any other area of the battery, determine that the sudden change in voltage has occurred to the battery and the battery surface has the abnormal temperature area.

Specifically, whether the sudden change in voltage has occurred to the battery and whether the battery surface has the abnormal temperature area can be determined as follows through operations at S11-S13.

At S11, acquire in real time a voltage of the battery, and acquire in real time temperature of each area of the battery surface of the battery. The battery surface is divided into multiple areas.

In an implementation, temperature detection technologies such as those conducted with a heat resistor or a thermocouple can be adopted to detect the temperature of the each area of the battery surface. Adopting the heat resistor or thermocouple related temperature detection technology makes it easier to achieve integration, thereby making it convenient to achieve temperature detection in a small device or a portable device.

Specifically, the battery surface can be divided into multiple areas, each area is provided with a temperature sensing probe, and temperature of the each area is detected in real time through the temperature sensing probe. That is to say, in an implementation, the temperature of each area is acquired through a temperature sensing probe disposed corresponding to the each area.

Figure 4:
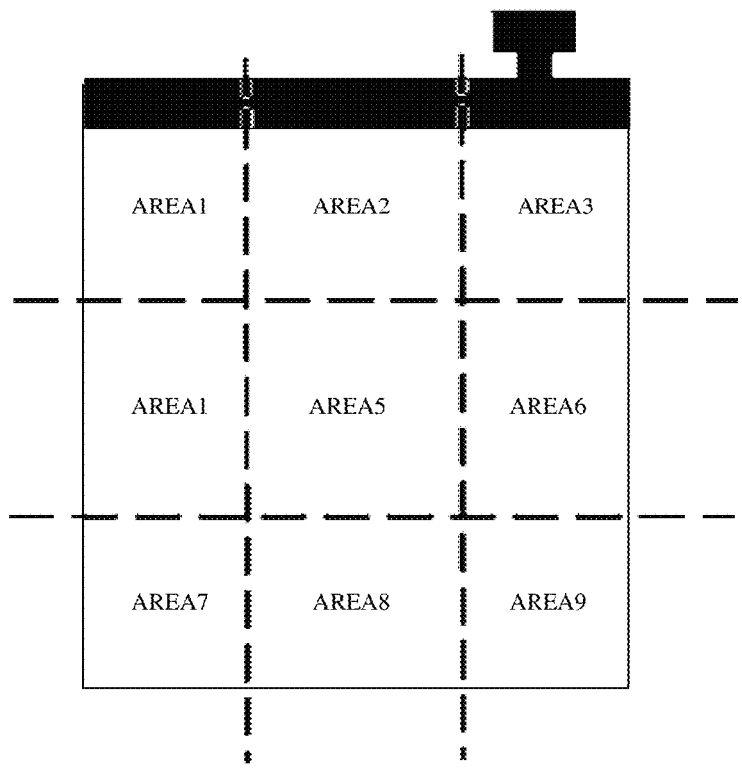
FIG. 4 is a schematic diagram illustrating a division of areas of a battery surface according to an implementation of the present disclosure.

In an implementation, as illustrated in FIG. 4, the multiple areas are arranged in array. For example, Area 1 to Area 9 are in a 3*3 array.

Figure 5:
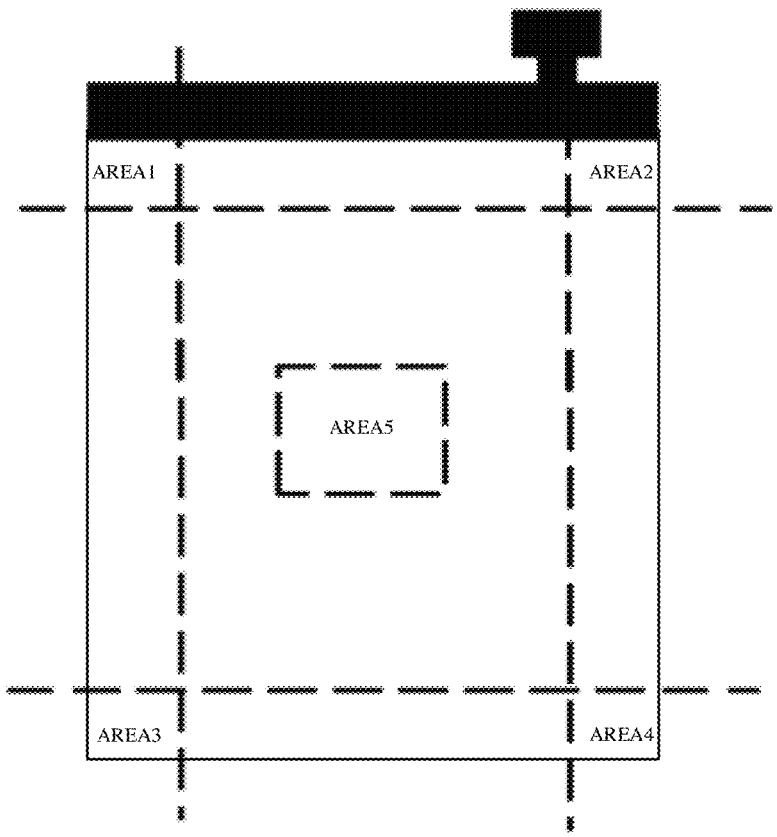
FIG. 5 is a schematic diagram illustrating a division of areas of a battery surface according to another implementation of the present disclosure.

In another implementation, in order to reduce complexity of a temperature detecting scheme, the temperature sensing probe can also be disposed only in areas of the battery that are easy to be damaged, such as a corner area of the battery, a head area of the battery, and a tail area of the battery, as illustrated in FIG. 5. In other words, the multiple areas can include a corner area of the battery, a head area of the battery, and a tail area of the battery.

At S12, determine whether the sudden change in voltage has occurred to the battery according to the voltage of the battery acquired in real time, and determine whether the battery surface has the abnormal temperature area according to the temperature of each area.

Figure 6:
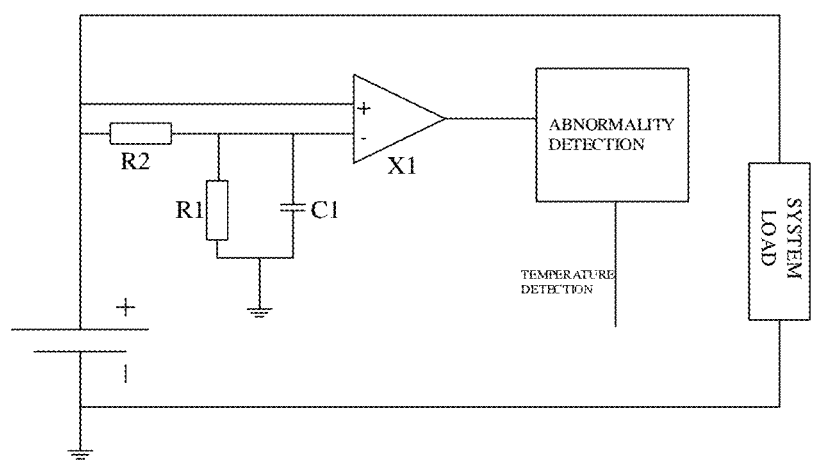
FIG. 6 is a schematic diagram illustrating a voltage-sudden-change detecting circuit according to an implementation of the present disclosure.

In an implementation, a differential amplifying circuit can be built to detect in real time the voltage of the battery. As an implementation, the differential amplifying circuit, as illustrated in FIG. 6, can include a resistor R1, a resistor R2, a capacitor C1, and a differential amplifier X1. The resistor R2 has one end coupled with a positive electrode of the battery and the other end coupled with a negative input end of the differential amplifier X1. The resistor R1 and the capacitor C1 form an RC voltage-stabilizing and filtering circuit. The resistor R1 has one end coupled with the negative input end of the differential amplifier X1 and the other end grounded. The capacitor C1 is coupled in parallel with the resistor R1. The differential amplifier X1 has a positive input end also coupled with the positive electrode of the battery. Through the differential amplifying circuit, real-time detection of the voltage of the battery can be achieved, and whether a sudden change has occurred to the voltage of the battery can be determined according to a signal output by the differential amplifying circuit.

It can be understood that, the negative input end of the differential amplifier X1 is grounded via the capacitor C1. When the sudden change in voltage has occurred to the battery, due to the capacitor, a voltage of the negative input end of the differential amplifier X1 will remain unchanged within a certain time period, while a voltage of the positive input end of the differential amplifier X1 will suddenly change directly, and output of the differential amplifier X1 will be inverted, therefore, it is possible to determine whether the sudden change in voltage has occurred to the battery by monitoring an output signal of the differential amplifier X1.

It should be noted that, in other implementations of the present disclosure, the voltage of the battery can also be detected in real time through other voltage detecting circuits, to achieve real-time detection of the voltage of the battery. The circuit for detecting the voltage of the battery can be implemented in various manners, which is known to those skilled in the art and will not be described in detail herein.

In addition, whether the battery surface has the abnormal temperature area can be determined by determining whether there is an area of which a temperature is higher than temperatures of other areas, or by determining whether there is an area of which a temperature is higher than a preset temperature threshold. For example, when an area is detected to have a temperature higher than temperatures of other areas, the area can be regarded as the abnormal temperature area, in other words, the battery surface has the abnormal temperature area.

By comparing the temperature of each area, interference of outside temperature with detection results can also be avoided, thereby improving detection accuracy.

At S13, determine that the battery is currently abnormal, upon determining that the sudden change in voltage has occurred to the battery and the battery surface has an abnormal temperature area.

In implementations of the disclosure, the inventor, through a quantity of tests and experiments, has found that when the battery is used normally, the voltage of the battery is relatively steady, and temperatures of the battery surface are relatively balanced. However, when the battery is subject to an external mechanical damage such as dropping, colliding, squeezing, piercing, and the like, there will be a sudden change in the voltage of the battery together with partially high temperature. Therefore, according to the method for monitoring battery safety of a terminal device provided herein, whether the battery is currently damaged is monitored by detecting whether the sudden change in voltage has occurred to the battery and detecting whether the battery surface has the abnormal temperature area. Once the sudden change in voltage is detected to have occurred to the battery and the battery surface is detected to have the abnormal temperature area, it indicates that the battery is currently damaged, the internal short-circuit has occurred, and the battery is determined to be currently abnormal with some potential safety hazard.

In one implementation, when the battery is in a no-load state or a light-load state, upon determining that the sudden change in voltage has occurred to the battery and the battery surface has the abnormal temperature area, the battery is determined to be currently abnormal. The "no-load state" means that the battery is currently not discharged and there is no battery consumption current, for instance, the terminal device is in the power-off state. The "light-load state" means that present consumption current of the battery is very small, such as approximately 5 mA to 6 mA, for instance, the terminal device is in a screen-off state or in a light-system-load state.

When the battery is in the no-load state or in the light-load state, whether the sudden change in voltage has occurred to the battery and whether the battery surface has the abnormal temperature area are monitored, which can get rid of interference of an instant drop in voltage and an increase in temperature of the battery surface due to a sudden change in system load, thereby improving detection accuracy.

In addition, whether the sudden change in voltage has occurred to the battery can be determined according to the voltage of the battery acquired in real time as follows. Determine whether an instant drop in voltage has occurred to the battery according to the voltage of the battery acquired in real time. Determine that the sudden change in voltage has occurred to the battery when the instant drop in voltage has occurred to the battery.

When a magnitude of decrease in the voltage of the battery within a preset time period is greater than or equal to a preset threshold, determine that the instant drop in voltage has occurred to the battery.

Specifically, as an implementation, when the battery is in the no-load state or the light-load state, the preset threshold is greater than or equal to 10 mV, such as 150 mV to 400 mV.

Figure 7:
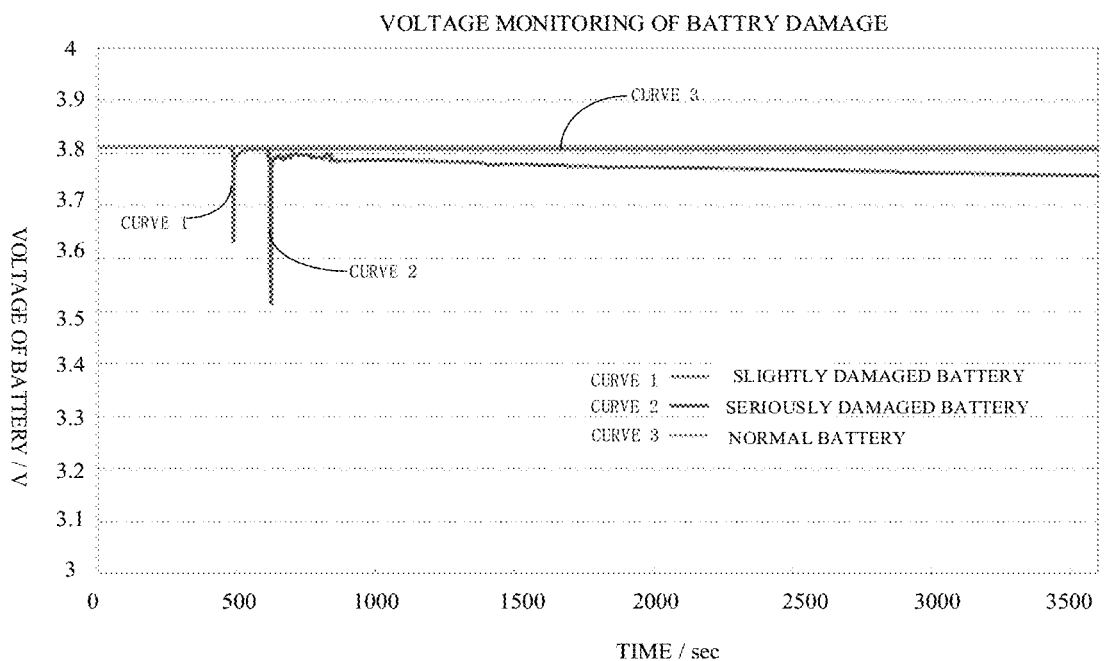
FIG. 7 is a schematic diagram illustrating a voltage monitoring curve of a damaged battery and a voltage monitoring curve of a normal battery according to an implementation of the present disclosure.

Specifically, in one implementation, voltage monitoring curves in a process in which the battery is subject to damage are illustrated in FIG. 7. Curve 1 is a voltage curve of a slightly damaged battery. Curve 2 is a voltage curve of a seriously damaged battery. Curve 3 a voltage curve of a normal battery that not damaged at all. According to Curve 1, when the battery is slightly damaged, the voltage of the battery changes suddenly from 3.8V to 3.63V in an instant and then is restored to about 3.8V. According to Curve 2, when the battery is seriously damaged, the voltage of the battery changes suddenly from 3.8V to 3.51V in an instant and then is restored to nearly 3.8V. According to Curve 3, for a normal battery, which is not damaged, the voltage of the battery remains nearly 3.8V. Therefore, by comparison of Curve 1, Curve 2, and Curve 3, once the battery is subject to an external mechanical damage such as dropping, colliding, squeezing, piercing, and the like, there will be a sudden change in the voltage of the battery, that is, the voltage will drop instantly. In addition, different degrees to which the battery is damaged result in different magnitudes of drops in the voltage.

In one implementation, the charging-discharging capacity difference of the battery can be acquired as follows. Acquire a charging capacity when the battery is charged from a first state of charge (SOC) value to a second SOC value, acquire a discharging capacity when the battery is discharged from the second SOC value to the first SOC value, and acquire the charging-discharging capacity difference of the battery according to the charging capacity and the discharging capacity. Alternatively, acquire a charging capacity when the battery is charged from a first voltage to a second voltage, acquire a discharging capacity when the battery is discharged from the second voltage to the first voltage, and acquire the charging-discharging capacity difference of the battery according to the charging capacity and the discharging capacity.

Specifically, first, acquire charging capacity information during charging of the battery and discharging capacity information during discharging of the battery.

In one implementation, the terminal device can be provided with a specific power detecting circuit or program, or an independent battery-safety monitoring application (APP) designated by a manufacturer, thereby detecting the change in capacity during charging and discharging of the battery through the specific power detecting circuit or program, or the APP. For example, a battery-safety monitoring APP for detecting capacity of the battery can be installed in the terminal device, and the APP can be set to detect a corresponding charging capacity/a corresponding discharging capacity when the battery is charged/discharged from one specific SOC value or one specific voltage to another specific SOC value or another specific voltage.

Optionally, the terminal device can be, but is not limited to, a smart phone, a tablet PC, a pocket reader, etc. The battery can be a Lithium battery.

Second, acquire the change in capacity during charging and discharging of the battery according to the charging capacity information and the discharging capacity information.

For example, acquire the charging capacity (that is, battery capacity corresponding to a charging process) when the battery is charged from the first SOC value to the second SOC value, and acquire the discharging capacity (that is, battery capacity corresponding to a discharging process) when the battery is discharged from the second SOC value to the first SOC value, whereby the charging-discharging capacity difference of the battery can be obtained according to the charging capacity and the discharging capacity. As an example, as to a 2910 mAh/4.4V battery, set the first SOC value to 0.3 and the second SOC value to 0.9. If the charging capacity when the battery is charged from the first SOC value to the second SOC value is 1790 mAh, and the discharging capacity when the battery is discharged from the second SOC value to the first SOC value is 1776 mAh, the charging-discharging capacity difference of the battery is 14 mAh. Alternatively, acquire a charging capacity when the battery is charged from a first voltage to a second voltage, and acquire a discharging capacity when the battery is discharged from the second voltage to the first voltage, whereby the charging-discharging capacity difference of the battery can be obtained according to the charging capacity and the discharging capacity. As an example, as to a 2910 mAh/4.4V battery, set the first voltage to 3.7V and the second voltage to 4.2V. If the charging capacity when the battery is charged from 3.7V to 4.2V is 2985 mAh, and the discharging capacity when the battery is discharged from 4.2V to 3.7V is 2980 mAh, the charging-discharging capacity difference of the battery is 5 mAh.

It should be noted that, charging of the battery from the first SOC value to the second SOC value and discharging from the second SOC value to the first SOC value as described above, or charging of the battery from the first voltage to the second voltage and discharging from the second voltage to the first voltage as described above is a continuous charging-discharging process of the battery. It can be appreciated that, a continuous discharging-charging process of the battery can also be detected, that is, acquire first the discharging capacity when the battery is discharged from the second SOC value to the first SOC value, and then acquire the charging capacity when the battery is charged from the first SOC value to the second SOC value, or acquire first the discharging capacity when the battery is discharged from the second voltage to the first voltage, and then acquire the charging capacity when the battery is charged from the first voltage to the second voltage, thereby calculating the difference between the charging capacity and the discharging capacity.

Third, determine whether the battery is abnormal according to the change in capacity during charging and discharging of the battery.

Specifically, determine whether the charging-discharging capacity difference of the battery is within the preset capacity range. If the charging-discharging capacity difference of the battery is within the preset capacity range, determine that the battery is normal; otherwise, if the charging-discharging capacity difference of the battery is not within the preset capacity range, determine that the battery is abnormal.

The preset capacity range can be 0-20 mAh, and can be pre-stored in a memory of the terminal device to be invoked when needed.

For instance, the capacity difference of 14 mAh is within the preset capacity range 0-20 mAh. In this case, determine that the battery is in a normal state. If, after dropping of the terminal device for example, the capacity difference detected by the APP is 200 mAh, which is beyond the preset capacity range 0-20 mAh, determine that the battery is abnormal.

Therefore, whether the battery is abnormal can be pre-determined by detecting the charging-discharging capacity difference of the battery, and control the terminal device to send alert information indicative of battery abnormality upon determining that the battery is abnormal, to remind the user to promptly deal with the abnormal battery, thereby avoiding in advance potential accidents.

In some implementations, battery capacities at two time points within a certain time period during charging and discharging of the battery can be acquired. For example, during charging of the battery, acquire battery capacity M at time point T, and acquire battery capacity N at time point T+t. After time period t has elapsed, if the change in capacity of the battery, that is, N−M, is not within the preset capacity range, determine that the battery is abnormal.

It should be noted that, there may be a correspondence between time period t and the preset capacity range, and such correspondence can be pre-stored in the memory of the terminal device to be invoked when needed.

Specifically, in room temperature, fifteen 2910 mAh/4.4V battery samples BLP627 (each battery sample is identified with its own battery bar code) are used as test objects, and battery safety test is conducted according to capacity change before and after dropping of these battery samples as well as capacity change during charging and discharging of these battery samples. Test data are illustrated in Table 1 as follows.

TABLE 1

| Number | Battery Bar Code | Capacity 1 (mAh) | Capacity difference (mAh) | Charging-discharging capacity difference 1 (mAh) | Initial Voltage (V) |
|---|---|---|---|---|---|
| 1 | 9560758B613MAP627647213042174 | 3010 | N/A | 9 | 4.39040 |
|  | Damaged after dropping, no voltage | — | — | — | — |
| 2 | 9560758B613MAP627647213042167 | 2984 | 17 | 5 | 4.38380 |
|  | 2# after dropping | 2967 |  | 3 | 4.38073 |

TABLE 1-continued

| Number | Battery Bar Code | Capacity 1 (mAh) | Capacity difference (mAh) | Charging-discharging capacity difference 1 (mAh) | Initial Voltage (V) |
|---|---|---|---|---|---|
| 3 | 9560758B613MAP627647213042172 | 2987 | N/A | 7 | 4.38430 |
|  | Corner area damaged after dropping, bulge | — |  | — |  |
| 4 | 9560758B613MAP627647213042176 | 3005 | 34 | 8 | 4.38920 |
|  | 4# after dropping | 2971 |  | 39 | 4.36987 |
| 5 | 9560758B613MAP627647213042140 | 2986 | 26 | 9 | 4.38540 |
|  | 5# after dropping (FPC damaged) | 2960 |  | 27 | 4.37636 |
| 6 | 9560758B613MAP627647213042143 | 2965 | 65 | 8 | 4.38390 |
|  | 6# after dropping | 2900 |  | 169 | 4.33968 |
| 7 | 9560758B613MAP627647213042153 | 2979 | N/A | 3 | 4.38430 |
|  | Damaged after dropping, no voltage | — |  | — |  |
| 8 | 9560758B613MAP627647213042142 | 2965 | N/A | 10 | 4.38650 |
|  | Damaged after dropping, no voltage | — |  | — |  |
| 9 | 9560758B613MAP627647213042164 | 2992 | 1001 | 11 | 4.38270 |
|  | 9# after dropping | 1991 |  | 117 | 4.22359 |
| 10 | 9560758B613MAP627647213042182 | 3001 | 102 | 7 | 4.39220 |
|  | 10# after dropping | 2899 |  | 409 | 4.33491 |
| 11 | 9560758B613MAP627647213042141 | 2989 | N/A | 8 | 4.38600 |
|  | Corner area damaged after dropping, bulge | — |  | — |  |
| 12 | 9560758B613MAP627647213042180 | 2989 | 26 | 7 | 4.38500 |
|  | 12# after dropping | 2963 |  | 59 | 4.36644 |
| 13 | 9560758B613MAP627647213042170 | 2984 | 27 | 8 | 4.38380 |
|  | 13# after dropping | 2957 |  | 794 | 4.32845 |
| 14 | 9560758B613MAP627647213042154 | 2984 | N/A | 11 | 4.38340 |
|  | 14# after dropping | / | / | / | / |
| 15 | 9560758B613MAP627647213042146 | 2946 | 19 | 5 | 4.3855 |
|  | 15# after dropping | 2927 |  | 10 | 4.38287 |

It should be noted that, data regarding "no voltage" after dropping of the battery are obviously abnormal data, thus can be excluded directly without test and will not be taken as reference data for comparison. Exemplarily, as to Battery No. 1, Battery No. 3, Battery No. 7, Battery No. 8, Battery No. 11, and Battery No. 14, the discharging capacity is unable to be detected after dropping, that is, the above batteries are obviously abnormal. Therefore, data corresponding to the above batteries are not taken as reference data for comparison.

As illustrated in Table 1, take Battery No. 2 and Battery No. 5 as examples to describe test principles. As to Battery No. 2, before dropping, capacity is 2984 mAh and the charging-discharging capacity difference is 5 mAh; after dropping, capacity is 2967 mAh and the charging-discharging capacity difference is 3 mAh. It can be seen that a capacity difference before and after dropping is 17 mAh, which is within the preset capacity range 0-20 mAh. The charging-discharging capacity difference after dropping is 3 mAh, which is also within the preset capacity range, 0-20 mAh. Therefore, Battery No. 2 is normal. As to Battery No. 5, before dropping, capacity is 2986 mAh and the charging-discharging capacity difference is 9 mAh; after dropping, a flexible printed circuit (FPC) is damaged, capacity is 2960 mAh, and the charging-discharging capacity difference is 27 mAh. It can be seen that the capacity difference before and after dropping is 26 mAh, which is not within the preset capacity range, 0-20 mAh. In addition, the charging-discharging capacity difference after dropping is 27 mAh, which is also not within the preset capacity range, 0-20 mAh. Thus, Battery No. 5 is abnormal.

It can be concluded from above that, after the battery has dropped and been damaged, substantial change will occur to both the charging capacity and the discharging capacity, and a degree of change varies with a degree of damage. A higher degree of damage leads to a greater charging-discharging capacity difference. That is to say, whether the battery is abnormal can be determined by detecting the change in the charging capacity and discharging capacity.

In an implementation, whether the battery is abnormal is determined according to the voltage decrease rate after the battery is fully charged as follows.

At S21, when the terminal device is in a low-power state, acquire the voltage decrease rate of the battery within a preset time period.

In the implementation, the low-power state includes a state in which the terminal device is fully charged and remains coupled with a charger. The state in which the terminal device is fully charged and remains coupled with a charger means that the battery is fully charged at present and the charger is still coupled with the terminal device. In this case, even though background applications of the terminal device are not closed, detection can still be conducted on the battery. The reason is that when a display screen of the terminal device is lit up and/or applications are launched, since the charger remains coupled with the terminal device, power consumption of the terminal device will be supplied completely by the charger.

When abnormality detection is executed on the battery, acquire the voltage decrease rate of the battery within the preset time period, and then determine whether the battery has safety hazard according to the acquired voltage decrease rate.

Specifically, acquisition of the voltage decrease rate of the battery within the preset time period can be achieved as follows. After the terminal device enters the low-power state and lasts for a first preset time period, acquire the voltage of the battery once every second preset time period. Calculate the voltage decrease rate according to the voltage of the battery that is detected at the interval of the second preset time period.

For example, plug the charger into a terminal device (such as a mobile phone) to be tested, and then begin to charge the terminal device. After the terminal device is fully charged, observe drops in the voltage of the battery without unplugging the charger, and record data as illustrated in Table 2. Thereafter, observe, according to the data in Table 2, influence of main-board power consumption on the voltage of the battery without unplugging the charger.

TABLE 2

| Number | Initial Voltage When Fully Charged (V) | Voltage after 1 h (V) | Voltage variation in 1 h (mV) | Voltage after 1 h10 min (V) | Voltage variation in 10 min (mV) | Voltage after 1 h20 min (V) | Voltage variation in 20 min (mV) |
|---|---|---|---|---|---|---|---|
| 1# | 4.2883 | 4.28377 | 4.53 | 4.28358 | 0.19 | 4.28344 | 0.33 |
| 2# | 4.2935 | 4.28988 | 3.62 | 4.2897 | 0.18 | 4.28954 | 0.34 |
| 3# | 4.33375 | 4.30132 | 32.43 | 4.30106 | 0.26 | 4.30085 | 0.47 |
| 4# | 4.28713 | 4.28355 | 3.58 | 4.28336 | 0.19 | 4.2832 | 0.35 |
| 5# | 4.29083 | 4.28566 | 5.17 | 4.28544 | 0.22 | 4.28529 | 0.37 |
| 6# | 4.29926 | 4.29336 | 5.9 | 4.29305 | 0.31 | 4.29282 | 0.54 |
| 7# | 4.30773 | 4.30063 | 7.1 | 4.30035 | 0.28 | 4.30013 | 0.5 |
| 8# | 4.2945 | 4.29 | 4.5 | 4.28975 | 0.25 | 4.28954 | 0.46 |
| 9# | 4.30185 | 4.29449 | 7.36 | 4.29412 | 0.37 | 4.29386 | 0.63 |
| 10# | 4.2983 | 4.29463 | 3.67 | 4.29442 | 0.21 | 4.29426 | 0.37 |

Rated capacity of the battery is 2750 mAh, and rated voltage is 4.35V. 1 # to 10 # indicate ten different samples for test.

As illustrated in Table 2, without unplugging the charger, when the battery is normal, the amount of voltage variation can be kept within 1 mV in a pre-determined time period (such as the second preset time period, 10 min) after the battery is fully charged and let stand for a time period (such as the first preset time period, 1 h).

Then, select a new battery, charge the battery up to half of its capacity (that is, half-charged), and drop the battery repeatedly from above 1.8 m (meters) ten times (six times for corners and four times for surfaces) per round. Each time after dropping, determine heating of the battery with an infrared thermal imager. Dropping will not be stopped until a change in temperature of a local area of the battery is higher than 5° C. Thereafter, the battery is put into the terminal device and fully charged, and begin to observe drops in voltage after dropping without unplugging the charger, as illustrated in Table 3.

TABLE 3

| Number | Initial Voltage When Fully Charged (V) | Voltage after 1 h (V) | Voltage variation in 1 h (mV) | Voltage after 1 h10 min (V) | Voltage variation in 10 min (mV) | Voltage after 1 h20 min (V) | Voltage variation in 20 min (mV) |
|---|---|---|---|---|---|---|---|
| 1# | 4.35534 | 4.34492 | 10.42 | 4.34267 | 2.25 | 4.34025 | 4.67 |
| 2# | 4.3505 | 4.34040 | 10.1 | 4.34001 | 0.39 | 4.33758 | 2.82 |
| 3# | 0 after dropping | — | — | — | — | — | — |
| 4# | 3.96729 | 3.88115 | 86.14 | 3.84007 | 41.08 | 3.81649 | 64.66 |
| 5# | 4.009 | 3.89051 | 118.49 | 3.86254 | 27.97 | 3.83642 | 54.09 |
| 6# | 0 after dropping | — | — | — | — | — | — |
| 7# | 4.25526 | 4.25114 | 4.12 | 4.24989 | 1.25 | 4.24875 | 2.39 |
| 8# | 0 after dropping | — | — | — | — | — | — |
| 9# | 4.36606 | 4.36579 | 0.27 | 4.36552 | 0.27 | 4.36504 | 0.75 |
| 10# | 4.36916 | 4.36880 | 0.36 | 4.3683 | 0.5 | 4.36822 | 0.58 |

The rated capacity of the battery is 2980 mAh, and the rated voltage is 4.35V. 1 #to 10 #indicate ten different samples for test. In addition, after the dropping test, as to samples 4 # and 5 #, heating lasts apparently, the voltage thereof can only reach about 4V but cannot reach a higher voltage by charging.

It can be seen from Table 3 that, after the battery is damaged due to dropping, without unplugging the charger, the amount of voltage variation is relatively significant within a pre-determined time period (such as the second preset time period, 10 min) after the battery is fully charged and let stand for a time period (such as the first preset time period, 1 h). Therefore, whether the battery is abnormal can be detected with high probability according to the voltage variation.

As an implementation, when the terminal device is fully charged and stays coupled with the charger, after a delay of the first preset time period (such as 1 h), applications related to the present disclosure begin to detect the voltage of the battery once every the second preset time period (such as 10 min) through a voltage feedback module of a charging integrated circuit (IC). Exemplarily, the voltage of the battery detected at time point t1 is V1, and the voltage of the battery detected after a delay of time period t2 is V2. Then the voltage decrease rate $\Delta V$ can be calculated according to V1, V2, and t2, that is, $\Delta V=(V1-V2)/t2$, and thus whether the battery is abnormal can be determined according to the voltage decrease rate within the preset time period.

At S22, determine whether the battery is abnormal according to the voltage decrease rate within the preset time period.

Specifically, whether the battery is abnormal can be determined according to the voltage decrease rate within the preset time period as follows. Determine whether the voltage decrease rate is greater than or equal to the preset rate. Upon determining that the voltage decrease rate is less than the preset rate, determine that the battery is normal. Upon determining that the voltage decrease rate is greater than or equal to the preset rate, determining that the battery is abnormal.

For instance, according to test results illustrated in Table 2 and Table 3, the preset rate can be set to 1 mV, whereby most abnormal situations can be detected. For example, when the terminal device is in the low-power state, after the delay of the first preset time period (such as 1 h), acquire once the voltage of the battery, which is recorded as V1, and after a delay of the second preset time period (such as 10 min), acquire again the voltage of the battery, which is recorded as V2. Then calculate the voltage decrease rate $\Delta V$ according to V1, V2, and t2, that is, $\Delta V=(V1-V2)/t2$ and determine whether the voltage decrease rate is greater than or equal to the preset rate (that is, 1 mV). If $\Delta V$ is less than 1 mV, determine that the battery is normal. If $\Delta V$ is greater than or equal to 1 mV, determine that the battery is abnormal. However, determining whether the battery is abnormal based on one detection leads to higher false identification rate. Therefore, in order to improve determination accuracy, a manner in which multiple detections are conducted can be adopted. For example, determine that the battery is normal upon determining that the voltage decrease rate $\Delta V$ is less than 1 mV continuously three times or more than three times. Otherwise, determine that the battery is abnormal.

When the battery is subject to an external mechanical damage, such as squeezing, dropping, piercing, etc., an internal short circuit will occur inside the battery. Due to the internal short circuit, there is some leakage current during charging of the damaged battery. Since charging current in the constant-voltage charging stage is small, charging duration of the damaged battery in the constant-voltage charging stage will be substantially longer.

In an implementation, whether the battery is abnormal is determined according to the duration of the constant-voltage charging stage as follows.

At S31, acquire the duration of the constant-voltage charging stage during charging of the battery.

Figure 8:
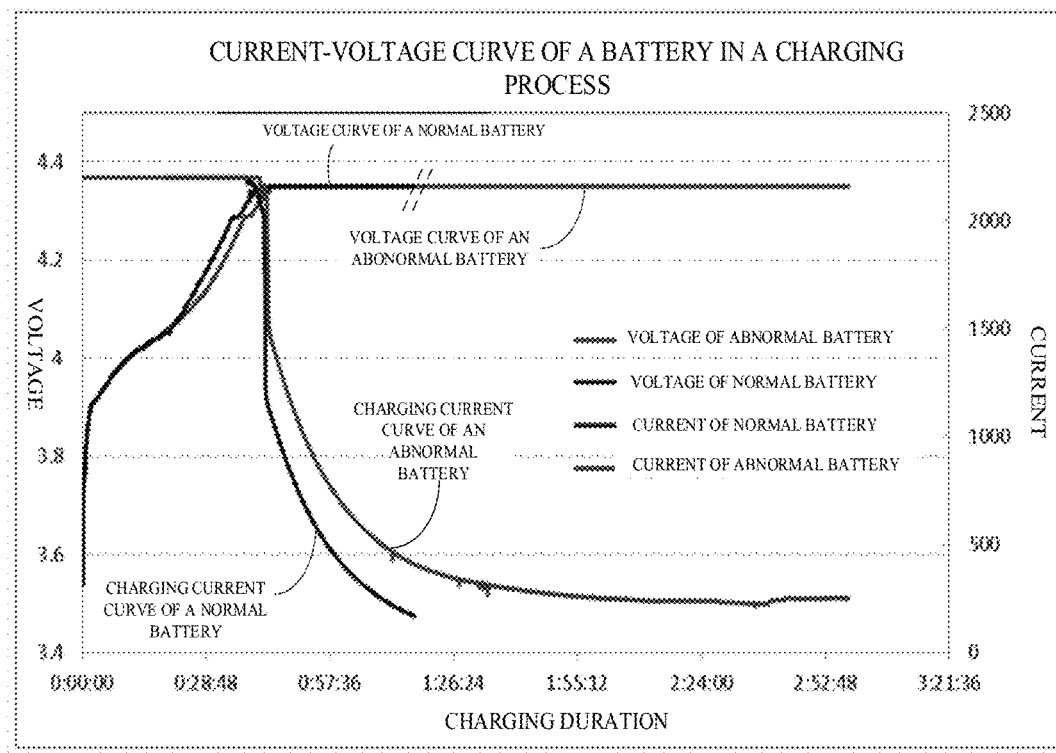
FIG. 8 is schematic diagram illustrating contrast between curves of a normal battery and an abnormal battery in terms of voltage/current in a constant-voltage charging stage according to an implementation of the present disclosure.

A charging process of the terminal device generally includes a trickle charging stage, a constant-current charging stage, and a constant-voltage charging stage. In the constant-voltage charging stage, a voltage feedback loop can be utilized to make voltage applied to the battery in the constant-voltage charging stage satisfy an expected charging voltage of the battery. For example, as illustrated in FIG. 8, when the voltage of the battery is equal to 4.35V, proceed to the constant-voltage charging stage, in which charging voltage is constantly 4.35V. When the battery is fully charged gradually, charging current will decrease. When the charging current is smaller than a preset cut-off charging current such as 100 mA, the battery can be determined to be fully charged.

In the constant-voltage charging stage, when the battery is abnormal due to damage, a local internal short circuit will occur inside the battery. Due to such internal short circuit, there is some leakage current in the damaged battery in the constant-voltage charging stage. In addition, since the charging current in the constant-voltage charging stage is small, the charging duration of the damaged battery in the constant-voltage charging stage will be substantially longer, which is illustrated in FIG. 8.

At S32, determine whether the duration acquired at S31 is longer than or equal to the preset duration.

At S33, upon determining that the duration is longer than or equal to the preset duration, determine that the battery is abnormal.

Therefore, during charging of the terminal device, whether a self-consumption current occurs to the battery due to internal short circuit is determined by monitoring the duration of the constant-voltage charging stage, which is possible to identify accurately whether the battery is abnormal.

In addition, the duration is acquired when the terminal device is in the low-power state. That is to say, when the terminal device is in the low-power state, the consumption current of the terminal device is very small, which will not cause interference with short-circuit leakage current of the abnormal battery, thereby improving detection accuracy.

In implementations of the disclosure, the low-power state can include a screen-off state and a power-off state, that is, the battery is in a no-load state or a light-load state. The "no-load state" means that the battery is currently not discharged and there is no external consumption current (not including the self-consumption current caused by the internal short circuit of the battery), for instance, the terminal device is in the power-off state. The "light-load state" means that present consumption current of the battery is very small, such as approximately 5 mA to 6 mA, for instance, the terminal device is in the screen-off state or in a state where the system load is very small.

In addition, it should be noted that, the "screen-off state" means that the display screen of the terminal device is in an off-state, and all applications in the background are closed with only the applications related to the present disclosure in the launched state. That is to say, during safety monitoring of the battery, the terminal device is kept in a state of nearly no power consumption. In this way, the duration acquired is more accurate, which can avoid inaccuracy of detection because of power consumption of the display screen or power consumption of applications.

As an implementation, during charging of the battery, trickle charging will be conducted first, and followed by constant-current charging and constant-voltage charging. When the charging voltage reaches, for example, 4.35V, proceed to the constant-voltage charging stage, in which the charging voltage is constantly 4.35V. When the battery is fully charged gradually, the charging current will decrease. When the charging current is smaller than the preset cut-off charging current such as 100 mA, the battery can be determined to be fully charged, and the duration of the constant-voltage charging stage of the battery is acquired.

When the battery is abnormal due to damage, since the damaged battery has some short-circuit self-consumption current, the duration of the constant-voltage charging stage will be longer. Therefore, whether the battery is abnormal can be identified according to the duration.

In implementations of the disclosure, detection accuracy can be improved by decreasing the preset cut-off charging current. In other words, by setting the preset cut-off charging current close to the short-circuit leakage current inside the battery as much as possible, it is easier to identify whether the battery is abnormal due to damage.

In an implementation, during charging of the battery, charging current and charging voltage of the battery are restricted and the terminal device is controlled to send the alert information indicative of battery abnormality, when any one of the following is met: (1) the disconnection between the battery connector and the main board is determined to be a private disconnection according to the power-failure information; (2) the sudden change in voltage has occurred to the battery and the battery surface has the abnormal temperature area; (3) the duration of the constant-voltage charging stage during charging of the battery is longer than or equal to a preset duration; (4) a charging-discharging capacity difference of the battery is determined not to be within a preset capacity range according to the charging capacity and discharging capacity; (5) the voltage decrease rate after the battery is fully charged is greater than or equal to a preset rate.

In other words, when the status information of the battery is monitored, as long as one of the above is met, determine that the battery is abnormal, and then restrict the charging current and the charging voltage of the battery during charging of the battery, which avoids effectively risks and improves security. In addition, the terminal device is controlled to send the alert information indicative of battery abnormality.

Figure 9:
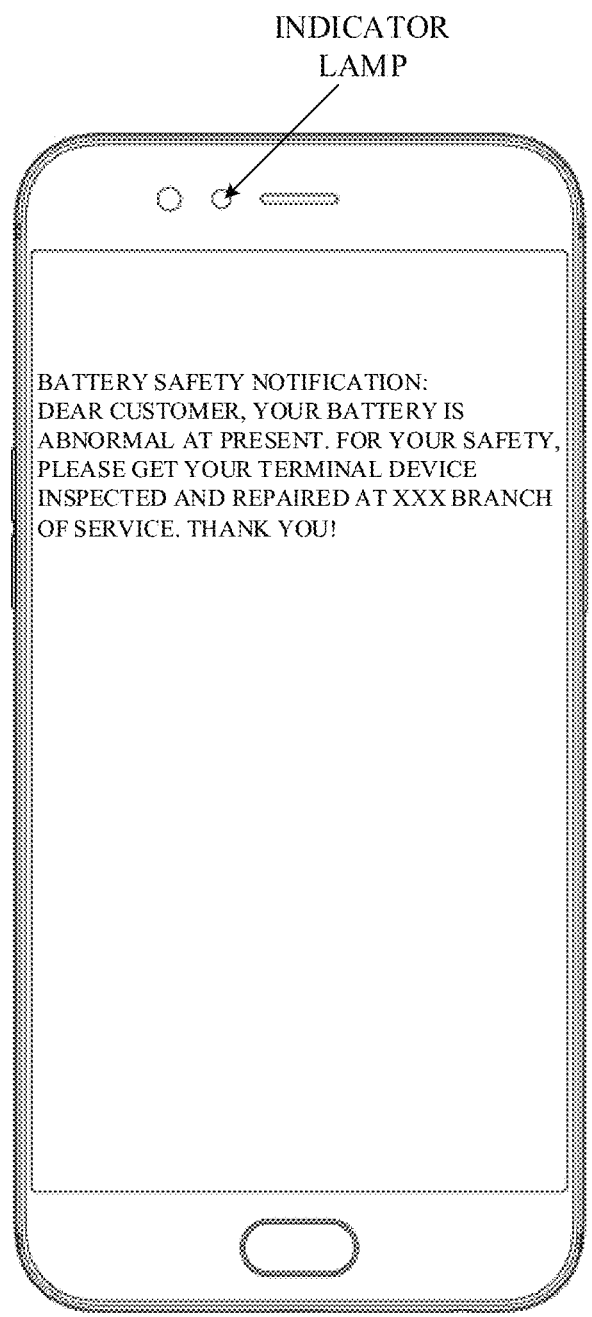
FIG. 9 is a schematic diagram illustrating alert information of a terminal device according to an implementation of the present disclosure.

For instance, when the battery is monitored to be abnormal, it is necessary to send alert information to a user. As an implementation, as illustrated in FIG. 9, the user can be reminded by such alert information as "Battery safety notification: dear customer, your battery is abnormal due to damage at present. For your safety, please get your terminal device inspected and repaired at xxx branch of service. Thank you". As another implementation, when the user is reminded through the alert information illustrated in FIG. 9, the user can be further reminded by an indicator lamp flashing. For example, control the indicator lamp to flash on red at a high frequency. As yet another implementation, the user can be further reminded through a speech function of the terminal device.

In general, when the user receives the above alert information, the user will promptly get the terminal device inspected and repaired. However, some users may fail to realize the seriousness of the problem when they receive the alert information. Therefore, they are likely to ignore the alert information and continue using the terminal device as usual. In this case, the user can be reminded multiple times. For example, the user can be reminded at least three times. When the user still does not deal with the problem after being reminded multiple times, some functions of the terminal device can be restricted.

For instance, generally speaking, lower power consumption of applications of the terminal device leads to lower heating when the battery is in use. Exemplarily, only an instant messaging (IM) application is launched without a video chat. In this case, power consumption is low, heating of the battery is low, and thus risks of the battery are less likely to occur. However, when power consumption of an application(s) is high, such as watching a video, playing a mobile game, etc., power consumption of the battery is high and heating of the battery is high, which can easily cause accidents. Therefore, when the battery is determined to be abnormal, forbid use of applications of high power consumption such as video applications, game applications, etc.

In addition, since heating can also occur in a charging process of the battery, especially in a quick charging state where more heating occurs within a short time, when the battery is determined to be abnormal, quick charging of the battery is also forbidden. In a more serious situation, the user is even forbidden to charge the battery for fear of accidents, and alert information such as "Due to damage of the battery, charging of the battery is forbidden. Please get the terminal device inspected and repaired at xxx branch of service. Thank you for your cooperation" is displayed on the display screen of the terminal device to remind the user.

To summarize, according to the method for monitoring battery safety of a terminal device, whether the terminal device meets the preset safety hazard condition is determined by acquiring the status information of the battery, to monitor, throughout the battery life, whether the safety hazard condition is triggered and protect effectively the battery when the safety hazard condition is triggered, thereby avoiding accidents caused by battery safety hazard, which improves considerably safety of the terminal device in use.

In addition, a non-transitory computer readable storage medium is provided in implementations of the disclosure. The non-transitory computer readable storage medium is configured to store computer programs which, when executed by a processor, are operable with the processor to execute the method for monitoring battery safety described above.

According to the non-transitory computer readable storage medium provided herein, by executing the method for monitoring battery safety described above, whether a safety hazard condition is triggered can be monitored throughout the battery life of a battery, and the battery can be protected effectively when the safety hazard condition is triggered, thereby avoiding accidents caused by battery safety hazard, which improves considerably safety of the terminal device in use.

Figure 10:
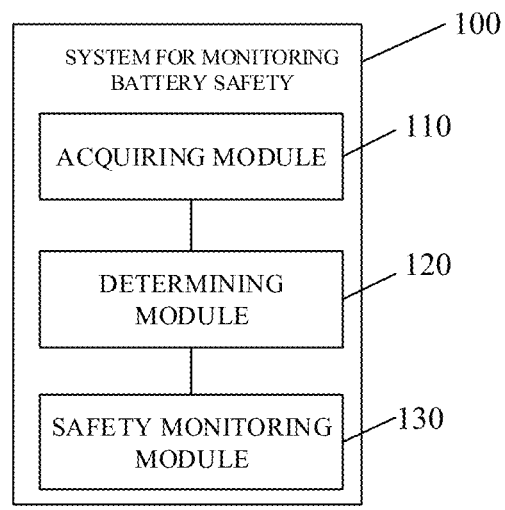
FIG. 10 is a block diagram illustrating a system for monitoring battery safety of a terminal device according to an implementation of the present disclosure.

FIG. 10 is a schematic block diagram illustrating a system for monitoring battery safety of a terminal device according to an implementation of the present disclosure. As illustrated in FIG. 10, the system 100 for monitoring battery safety of a terminal device includes an acquiring module 110, a determining module 120, and a safety monitoring module 130. The foregoing modules can be integrated into a processor or a controller for example.

The acquiring module 110 is configured to acquire status information of a battery of the terminal device. The status information includes at least two of: power-failure information generated upon disconnection between a battery connector of the terminal device and a main board of the terminal device, whether a sudden change in voltage has occurred to the battery and whether a battery surface has an abnormal temperature area, a duration of a constant-voltage charging stage during charging of the battery, charging capacity and discharging capacity of the battery, and a voltage decrease rate after the battery is fully charged. The determining module 120 is configured to determine whether the terminal device meets a preset safety hazard condition according to the status information. The safety monitoring module 130 is configured to control the terminal device to be in a power-off state or configured to disconnect a power supply circuit upon determining, by the determining module 120, that the terminal device meets the preset safety hazard condition.

In an implementation, as illustrated in FIG. 3, battery-abnormality monitoring can be conducted throughout the battery life of the battery. For example, before the battery is damaged, whether disconnection between the battery connector and the main board is a private disconnection can be determined by acquiring the power-failure information generated when the battery connector is disconnected from the main board; when the battery is damaged, whether the battery is currently abnormal due to damage can be determined by monitoring whether the sudden change in voltage has occurred to the battery and detecting temperatures of the battery surface; during charging of the battery, whether the battery is abnormal can be determined by monitoring the duration of the constant-voltage charging stage during charging of the battery; after the battery is fully charged, whether the battery is abnormal can be determined by monitoring the voltage decrease rate within a preset time period; when the battery is in use, for example, during charging and discharging, whether the battery is abnormal can be determined by monitoring change in capacity of the battery.

Therefore, in the implementation, battery-abnormality can be comprehensively monitored, whether the safety hazard condition is triggered is determined according to the monitored status information of the battery, and when the safety hazard condition is triggered, disconnect directly the power supply circuit or control the terminal device to be in the power-off state.

In an implementation, the preset safety hazard condition includes any two of the following: (1) disconnection between the battery connector and the main board is determined to be a private disconnection according to the power-failure information; (2) the sudden change in voltage has occurred to the battery and the battery surface has the abnormal temperature area; (3) the duration of the constant-voltage charging stage during charging of the battery is longer than or equal to a preset duration; (4) a charging-discharging capacity difference of the battery is determined not to be within a preset capacity range according to the charging capacity and discharging capacity; (5) the voltage decrease rate after the battery is fully charged is greater than or equal to a preset rate.

Therefore, as long as any two of the above five are met, determine that the safety hazard condition is triggered.

In an implementation, the safety monitoring module 130 is configured to restrict charging current and charging voltage of the battery and control the terminal device to send alert information indicative of battery abnormality during charging of the battery, when any one of the following is met: (1) the disconnection between the battery connector and the main board is determined to be a private disconnection according to the power-failure information; (2) the sudden change in voltage has occurred to the battery and the battery surface has the abnormal temperature area; (3) the duration of the constant-voltage charging stage during charging of the battery is longer than or equal to a preset duration; (4) a charging-discharging capacity difference of the battery is determined not to be within a preset capacity range according to the charging capacity and discharging capacity; (5) the voltage decrease rate after the battery is fully charged is greater than or equal to a preset rate.

In other words, when the status information of the battery is monitored, as long as one of the above is met, determine that the battery is abnormal, and then restrict the charging current and the charging voltage of the battery during charging of the battery, which avoids effectively risks and improves security. In addition, the terminal device is controlled to send the alert information indicative of battery abnormality.

For instance, when the battery is monitored to be abnormal, it is necessary to send alert information to a user. As an implementation, as illustrated in FIG. 9, the user can be reminded by such alert information as "Battery safety notification: dear customer, your battery is abnormal due to damage at present. For your safety, please get your terminal device inspected and repaired at xxx branch of service. Thank you". As another implementation, when the user is reminded through the alert information illustrated in FIG. 9, the user can be further reminded by an indicator lamp flashing. For example, control the indicator lamp to flash on red at a high frequency. As yet another implementation, the user can be further reminded through a speech function of the terminal device.

In general, when the user receives the above alert information, the user will promptly get the terminal device inspected and repaired. However, some users may fail to realize the seriousness of the problem when they receive the alert information. Therefore, they are likely to ignore the alert information and continue using the terminal device as usual. In this case, the user can be reminded multiple times. For example, the user can be reminded at least three times. When the user still does not deal with the problem after being reminded multiple times, some functions of the terminal device can be restricted, for example, the charging voltage and the charging current during charging of the battery can be restricted.

In an implementation, the system for monitoring battery safety of a terminal device mentioned above further includes a generating module. The generating module is configured to generate power-failure state bit information when the battery connector is disconnected from the main board and to take the power-failure state bit information as the power-failure information. The determining module 120 is further configured to determine that the disconnection between the battery connector and the main board is the private disconnection upon determining that the power-failure state bit information is not reset or is not marked.

It should be understood that, the disconnection between the battery connector and the main board may be an after-sale disconnection, for example, an authorized entity disassembles the battery during a professional repair or detection, or may be the private disconnection, for example, a user of the terminal device or an unauthorized entity disassembles the battery privately.

When the authorized entity disassembles the battery, such disassembly behavior can be marked as normal through some operations, such as resetting or marking the power-failure state bit information.

However, since the user of the terminal device or the unauthorized entity may disassemble or assemble the terminal device in a less standardized manner, the private disconnection will usually lead to battery damage, such as making the battery subject to an external impact which is beyond an extent to which the battery is able to bear, contact failure when the battery connector and the main board are reconnected, etc., thereby resulting in battery safety hazard. Therefore, when the disconnection between the battery connector and the main board is the private disconnection, information regarding the private disconnection can be recorded to mark such private-disassembly behaviour.

In an implementation, the determining module 120 is further configured to determine that the sudden change in voltage has occurred to the battery and the battery surface has the abnormal temperature area, when an instant drop in voltage has occurred to the battery and the temperature of any one of areas of the battery is higher than that of any other area of the battery. The battery surface is divided into multiple areas.

In an implementation, temperature detection technologies such as those conducted with a heat resistor or a thermocouple can be adopted to detect the temperature of the each area of the battery surface. Adopting the heat resistor or thermocouple related temperature detection technology makes it easier to achieve integration, thereby making it convenient to achieve temperature detection in a small device or a portable device.

Specifically, the battery surface can be divided into multiple areas, each area is provided with a temperature sensing probe, and temperature of the each area is detected in real time through the temperature sensing probe. That is to say, in an implementation, the temperature of each area is acquired through a temperature sensing probe disposed corresponding to the each area.

In an implementation, as illustrated in FIG. 4, the multiple areas are arranged in array. For example, Area 1 to Area 9 are in a 3*3 array.

In another implementation, in order to reduce complexity of a temperature detecting scheme, the temperature sensing probe can also be disposed only in areas of the battery that are easy to be damaged, such as a corner area of the battery, a head area of the battery, and a tail area of the battery, as illustrated in FIG. 5. In other words, the multiple areas can include a corner area of the battery, a head area of the battery, and a tail area of the battery.

In addition, whether the battery surface has the abnormal temperature area can be determined by determining whether there is an area of which a temperature is higher than temperatures of other areas, or by determining whether there is an area of which a temperature is higher than a preset temperature threshold. For example, when an area is detected to have a temperature higher than temperatures of other areas, the area can be regarded as the abnormal temperature area, in other words, the battery surface has the abnormal temperature area.

In an implementation, the acquiring module 110 configured to acquire the charging-discharging capacity difference of the battery is configured to acquire a charging capacity when the battery is charged from a first SOC value to a second SOC value, acquire a discharging capacity when the battery is discharged from the second SOC value to the first SOC value, and acquire the charging-discharging capacity difference of the battery according to the charging capacity and the discharging capacity. Alternatively, the acquiring module 110 configured to acquire the charging-discharging capacity difference of the battery is configured acquire a charging capacity when the battery is charged from a first voltage to a second voltage, acquire a discharging capacity when the battery is discharged from the second voltage to the first voltage, and acquire the charging-discharging capacity difference of the battery according to the charging capacity and the discharging capacity.

In implementations of the disclosure, the safety monitoring module 130 can be a battery manager with a battery management function, a battery protection system with a battery protection function, or a terminal-device control system which integrates the battery management function, the battery protection function, and a terminal-device control function, which is not limited herein.

With aid of the system for monitoring battery safety of a terminal device provided herein, the acquiring module acquires the status information of the battery, the determining module determines whether the terminal device meets the preset safety hazard condition according to the status information, and the safety monitoring module controls the terminal device to be in the power-off state or disconnecting the power supply circuit upon determining, with the determining module, that the terminal device meets the preset safety hazard condition, therefore, whether the safety hazard condition is triggered can be monitored throughout the battery life of the battery, and the battery can be protected effectively when the safety hazard condition is triggered, thereby avoiding accidents caused by battery safety hazard, which improves considerably safety of the terminal device in use.

Implementations provided herein can be combined or substituted with each other without conflict.

Figure 11:
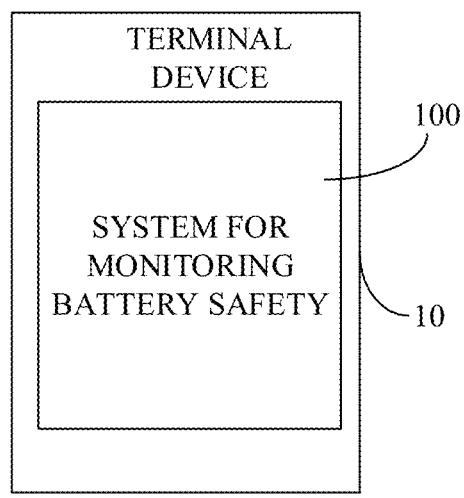
FIG. 11 is a block diagram illustrating a terminal device according to an implementation of the present disclosure.

For example, as illustrated in FIG. 11, a terminal device 10 is provided in an implementation of the disclosure. The terminal device 10 includes the above-mentioned system 100 for monitoring battery safety of a terminal device.

Figure 12:
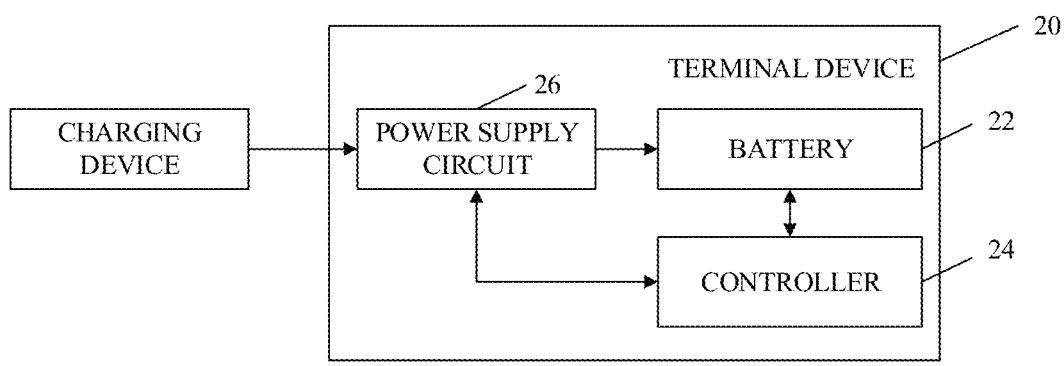
FIG. 12 is a block diagram illustrating a terminal device according to an implementation of the present disclosure.

Still another example, as illustrated in FIG. 12, a terminal device 20 in another form is provided. The terminal device 20 includes a battery 22 and a controller 24 coupled with the battery 22. The controller 24 is configured to execute, for example, the method described above with reference to the figures. The terminal device 20 may be coupled with charging device such as a power adapter, a portable battery, a computer, and the like. After connection between the terminal device and the charging device is connected, the battery 22 can be charged via the power supply circuit 26. The terminal device 20 may further include the differential amplifying circuit illustrated in FIG. 6, which will not be repeated herein to avoid redundancy.

According to the terminal device provided herein, with aid of the system for monitoring battery safety of a terminal device described above, whether a safety hazard condition is triggered can be monitored throughout the battery life of a battery, and the battery can be protected effectively when the safety hazard condition is triggered, thereby avoiding accidents caused by battery safety hazard, which improves considerably safety of the terminal device in use.

It should be understood that terms such as "center", "longitudinal", "lateral", "length", "width", "thickness", "on", "under", "front", "back", "left", "right", "vertical", "horizontal", "top", "bottom", "in", "out", "clockwise", "anticlockwise", "axial", "radial", "circumferential", and the like referred to herein which indicate directional relationship or positional relationship are directional relationship or positional relationship based on accompanying drawings and are only for the convenience of description and simplicity, rather than explicitly or implicitly indicate that apparatuses or components referred to herein must have a certain direction or be configured or operated in a certain direction and therefore cannot be understood as limitation on the disclosure.

In addition, terms "first", "second", and the like are only used for description and cannot be understood as explicitly or implicitly indicating relative importance or implicitly indicating the number of technical features referred to herein. Therefore, features restricted by terms "first", "second", and the like can explicitly or implicitly include at least one of the features. In the context of the disclosure, unless stated otherwise, "multiple" refers to "at least two", such as two, three, and the like.

Unless stated otherwise, terms "installing", "coupling", "connecting", "fixing", and the like referred to herein should be understood in broader sense. For example, coupling may be a fixed coupling, a removable coupling, or an integrated coupling, may be a mechanical coupling, an electrical coupling, and may be a direct coupling, an indirect coupling through a medium, or a communication coupling between two components or an interaction coupling between two components. For those of ordinary skill in the art, the above terms in the present disclosure can be understood according to specific situations.

Unless stated otherwise, a first feature being "on" or "under" a second feature referred to herein can refer to a direct contact between the first feature and the second feature or an indirect contact between the first feature and the second feature via a medium. In addition, the first feature being "above", "over", and "on" the second feature can be the first feature being right above or obliquely above the second feature or only refers to the first feature being at higher horizontal level than the second feature. The first feature being "below", "underneath", and "under" the second feature can be the first feature being right below or obliquely below the second feature or only refers to the first feature being at lower horizontal level than the second feature.

The reference term "an embodiment", "some embodiments", "implementation", "specific implementation", or "some implementations" referred to herein means that a particular feature, structure, material, or characteristic described in conjunction with the embodiment or implementation may be contained in at least one embodiment or implementation of the present disclosure. The phrase appearing in various places in the specification does not necessarily refer to the same embodiment or implementation. The particular feature, structure, material, or characteristic described may be properly combined in any one or more embodiments or implementations. In addition, when the embodiment or implementation is not mutually exclusive with other embodiments or implementations, it is expressly and implicitly understood by those skilled in the art that an embodiment described herein may be combined with other embodiments or implementations.

Those of ordinary skill in the art will appreciate that units (including sub-units) and algorithmic operations of various examples described in connection with implementations herein can be implemented by electronic hardware or by a combination of computer software and electronic hardware. Whether these functions are performed by means of hardware or software depends on the application and the design constraints of the associated technical solution. A professional technician may use different methods with regard to each particular application to implement the described functionality, but such methods should not be regarded as lying beyond the scope of the disclosure.

It will be evident to those skilled in the art that the corresponding processes of the above method implementations can be referred to for the working processes of the foregoing systems, apparatuses, and units, for purposes of convenience and simplicity and will not be repeated herein.

It will be appreciated that the systems, apparatuses, and methods disclosed in implementations herein may also be implemented in various other manners. For example, the above apparatus implementations are merely illustrative, e.g., the division of units (including sub-units) is only a division of logical functions, and there may exist other ways of division in practice, e.g., multiple units (including sub-units) or components may be combined or may be integrated into another system, or some features may be ignored or not included. In other respects, the coupling or direct coupling or communication connection as illustrated or discussed may be an indirect coupling or communication connection through some interface, device or unit, and may be electrical, mechanical, or otherwise.

Separated units (including sub-units) as illustrated may or may not be physically separated. Components or parts displayed as units (including sub-units) may or may not be physical units, and may reside at one location or may be distributed to multiple networked units. Some or all of the units (including sub-units) may be selectively adopted according to practical needs to achieve desired objectives of the disclosure.

Additionally, various functional units (including sub-units) described in implementations herein may be integrated into one processing unit or may be present as a number of physically separated units, and two or more units may be integrated into one.

If the integrated units are implemented as software functional units and sold or used as standalone products, they may be stored in a computer readable storage medium. Based on such an understanding, the essential technical solution, or the portion that contributes to the prior art, or all or part of the technical solution of the disclosure may be embodied as software products. Computer software products can be stored in a storage medium and may include multiple instructions that, when executed, can cause a computing device, e.g., a personal computer, a server, a second adapter, a network device, etc., to execute some or all operations of the methods as described in the various implementations. The above storage medium may include various kinds of media that can store program code, such as a USB flash disk, a mobile hard drive, a read-only memory (ROM), a random access memory (RAM), a magnetic disk, or an optical disk.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A method for monitoring battery safety of a terminal device, comprising:
    acquiring status information of a battery of the terminal device, wherein the status information comprises at least two of:
        power-failure information generated upon disconnection between a battery connector of the terminal device and a main board of the terminal device;
        whether a sudden change in voltage occurs to the battery and whether a battery surface has an abnormal temperature area;
        a duration of a constant-voltage charging stage during charging of the battery;
        charging capacity and discharging capacity of the battery;
        capacities of the battery before and after dropping; and
        a voltage decrease rate after the battery is fully charged;
    determining whether the terminal device meets a preset safety hazard condition according to the status information; and
    controlling the terminal device to be in a power-off state or disconnecting a power supply circuit upon determining that the terminal device meets the preset safety hazard condition;
    wherein the preset safety hazard condition comprises at least two of the following:
    the disconnection between the battery connector and the main board is a private disconnection;
    the sudden change in voltage occurs to the battery and the battery surface has the abnormal temperature area;
    the duration of the constant-voltage charging stage during charging of the battery is longer than or equal to a preset duration;
    a charging-discharging capacity difference of the battery is not within a preset capacity range;
    a capacity difference before and after dropping is not within the preset capacity range; and
    the voltage decrease rate after the battery is fully charged is greater than or equal to a preset rate;
    wherein the disconnection between the battery connector and the main board is determined to be the private disconnection according to the power-failure information;
    wherein power-failure state bit information is generated upon the disconnection between the battery connector and the main board and is taken as the power-failure information, wherein it is determined that the disconnection between the battery connector and the main board is the private disconnection, upon determining that the power-failure state bit information is not reset or is not marked.

2. The method of claim 1, wherein charging current and charging voltage of the battery are restricted and the terminal device is controlled to send alert information indicative of battery abnormality during charging of the battery, when any one of the preset safety hazard condition is met.

3. The method of claim 1, wherein it is determined that the sudden change in voltage occurs to the battery and the battery surface has the abnormal temperature area, when an instant drop in voltage occurs to the battery and a temperature of any one of a plurality of areas of the battery is higher than that of any other area of the battery, wherein the battery surface is divided into the plurality of areas.

4. The method of claim 3, wherein it is determined that the instant drop in voltage occurs to the battery according to an output signal of a differential amplifying circuit.

5. The method of claim 1, wherein the charging-discharging capacity difference of the battery is obtained by one of:
    acquiring the charging capacity when the battery is charged from a first state of charge (SOC) value to a second SOC value, acquiring the discharging capacity when the battery is discharged from the second SOC value to the first SOC value, and acquiring the charging-discharging capacity difference of the battery according to the charging capacity and the discharging capacity; and
    acquiring the charging capacity when the battery is charged from a first voltage to a second voltage, acquiring the discharging capacity when the battery is discharged from the second voltage to the first voltage, and acquiring the charging-discharging capacity difference of the battery according to the charging capacity and the discharging capacity.

6. A terminal device, comprising:
    a battery;
    a controller, configured to:
    acquire status information of the battery, wherein the status information comprises at least two of:
        power-failure information generated upon disconnection between a battery connector of the terminal device and a main board of the terminal device;
        whether a sudden change in voltage occurs to the battery and whether a battery surface has an abnormal temperature area;
        a duration of a constant-voltage charging stage during charging of the battery;

charging capacity and discharging capacity of the battery;

capacities of the battery before and after dropping; and a voltage decrease rate after the battery is fully charged;

determine whether the terminal device meets a preset safety hazard condition according to the status information; and control the terminal device to be in a power-off state or disconnecting a power supply circuit upon determining that the terminal device meets the preset safety hazard condition;

wherein the preset safety hazard condition comprises at least two of the following:

the disconnection between the battery connector and the main board is a private disconnection;

the sudden change in voltage occurs to the battery and the battery surface has the abnormal temperature area;

the duration of the constant-voltage charging stage during charging of the battery is longer than or equal to a preset duration;

a charging-discharging capacity difference of the battery is not within a preset capacity range;

a capacity difference before and after dropping is not within the preset capacity range; and the voltage decrease rate after the battery is fully charged is greater than or equal to a preset rate;

wherein the disconnection between the battery connector and the main board is determined to be the private disconnection according to the power-failure information;

wherein power-failure state bit information is generated upon the disconnection between the battery connector and the main board and is taken as the power-failure information, wherein it is determined that the disconnection between the battery connector and the main board is the private disconnection, upon determining that the power-failure state bit information is not reset or is not marked.

7. The terminal device of claim 6, wherein charging current and charging voltage of the battery are restricted and the terminal device is controlled to send alert information indicative of battery abnormality during charging of the battery, when any one of the preset safety hazard condition is met.

8. The terminal device of claim 6, further comprising a differential amplifying circuit, wherein the differential amplifying circuit comprises:

a differential amplifier X1, having a positive input end also coupled with a positive electrode of the battery;

a first resistor R1, having one end coupled with a negative input end of the differential amplifier X1 and the other end grounded;

a second resistor R2, having one end coupled with the positive electrode of the battery and the other end coupled with the negative input end of the differential amplifier X1; and a capacitor C1, coupled in parallel with the first resistor R1.

9. The terminal device of claim 8, wherein it is determined that an instant drop in voltage occurs to the battery according to an output signal of the differential amplifying circuit.

10. The terminal device of claim 9, wherein it is determined that the sudden change in voltage occurs to the battery and the battery surface has the abnormal temperature area, when the instant drop in voltage occurs to the battery and a temperature of any one of a plurality of areas of the battery is higher than that of any other area of the battery, wherein the battery surface is divided into the plurality of areas.

11. The terminal device of claim 6, wherein the charging-discharging capacity difference of the battery is obtained by one of:

acquiring the charging capacity when the battery is charged from a first state of charge (SOC) value to a second SOC value, acquiring the discharging capacity when the battery is discharged from the second SOC value to the first SOC value, and acquiring the charging-discharging capacity difference of the battery according to the charging capacity and the discharging capacity; and acquiring the charging capacity when the battery is charged from a first voltage to a second voltage, acquiring the discharging capacity when the battery is discharged from the second voltage to the first voltage, and acquiring the charging-discharging capacity difference of the battery according to the charging capacity and the discharging capacity.

12. A non-transitory computer readable storage medium configured to store computer programs which, when executed by a processor, are operable with the processor to carry out actions, comprising:

acquiring status information of a battery of a terminal device, wherein the status information comprises at least two of:

power-failure information generated upon disconnection between a battery connector of the terminal device and a main board of the terminal device;

whether a sudden change in voltage occurs to the battery and whether a battery surface has an abnormal temperature area;

a duration of a constant-voltage charging stage during charging of the battery;

charging capacity and discharging capacity of the battery;

capacities of the battery before and after dropping; and a voltage decrease rate after the battery is fully charged;

determining whether the terminal device meets a preset safety hazard condition according to the status information; and controlling the terminal device to be in a power-off state or disconnecting a power supply circuit upon determining that the terminal device meets the preset safety hazard condition;

wherein the preset safety hazard condition comprises at least two of the following:

the disconnection between the battery connector and the main board is a private disconnection;

the sudden change in voltage occurs to the battery and the battery surface has the abnormal temperature area;

the duration of the constant-voltage charging stage during charging of the battery is longer than or equal to a preset duration;

a charging-discharging capacity difference of the battery is not within a preset capacity range;

a capacity difference before and after dropping is not within the preset capacity range; and the voltage decrease rate after the battery is fully charged is greater than or equal to a preset rate;

wherein power-failure state bit information is generated upon the disconnection between the battery connector and the main board and is taken as the power-failure information, wherein it is determined that the disconnection between the battery connector and the main board is the private disconnection, upon determining that the power-failure state bit information is not reset or is not marked.

\* \* \* \* \*